(12) United States Patent
Choi

(10) Patent No.: US 11,488,674 B2
(45) Date of Patent: Nov. 1, 2022

(54) SEMICONDUCTOR MEMORY DEVICE AND METHOD OF OPERATING THE SAME

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/318,157

(22) Filed: May 12, 2021

(65) Prior Publication Data

US 2022/0148658 A1 May 12, 2022

(30) Foreign Application Priority Data

Nov. 10, 2020 (KR) .......................... 10-2020-0149655

(51) Int. Cl.
*G11C 11/00* (2006.01)
*G11C 16/26* (2006.01)
*G11C 16/04* (2006.01)
*G11C 16/24* (2006.01)
*G11C 16/34* (2006.01)
*G11C 16/10* (2006.01)

(52) U.S. Cl.
CPC .......... *G11C 16/26* (2013.01); *G11C 16/0483* (2013.01); *G11C 16/10* (2013.01); *G11C 16/24* (2013.01); *G11C 16/3459* (2013.01)

(58) Field of Classification Search
CPC ..... G11C 16/26; G11C 16/0483; G11C 16/10; G11C 16/24; G11C 16/3459
See application file for complete search history.

(56) References Cited

U.S. PATENT DOCUMENTS 9,245,639 B1 * 1/2016 Lee .......................... G11C 7/18
10,600,490 B1 * 3/2020 Liu ..................... G11C 16/0483
11,069,396 B2 * 7/2021 Choi ................... G11C 16/0483

FOREIGN PATENT DOCUMENTS

KR 10-2009-0026502 A 3/2009
KR 10-2014-0063146 A 5/2014

* cited by examiner

*Primary Examiner* — Pho M Luu

(74) *Attorney, Agent, or Firm* — IP & T Group LLP

(57) ABSTRACT

A semiconductor memory device includes a memory cell array, a peripheral circuit, and a control logic. The memory cell array includes a plurality of memory cells. The peripheral circuit is configured to perform a program operation and a read operation on the memory cell array. The control logic is configured to control an operation of the peripheral circuit. The control logic controls the peripheral circuit to perform an SLC program operation on memory cells included in a selected page among the plurality of memory cells, compares the number of first fail bits counted by performing a normal sensing operation on the selected page and the number of second fail bits counted by performing a multi-sensing operation on the selected page, and corrects at least one evaluation time to be used for a read operation based on a result of the comparison.

22 Claims, 19 Drawing Sheets

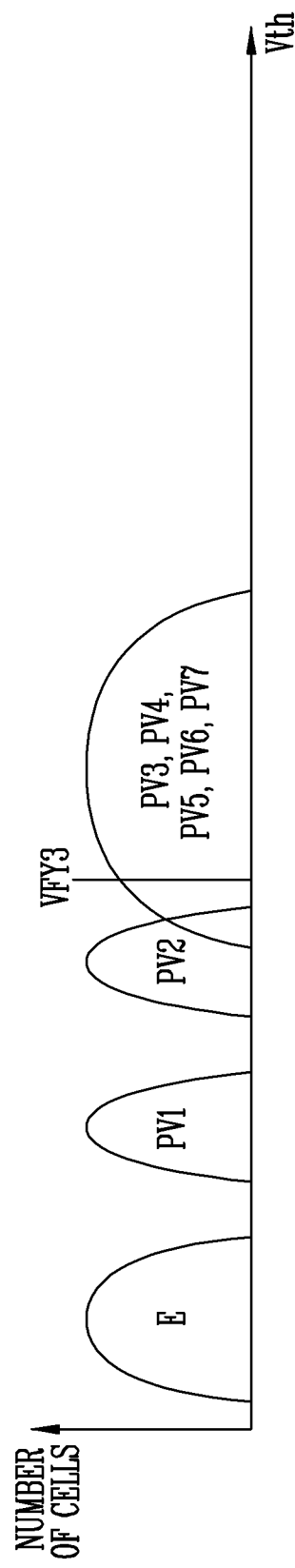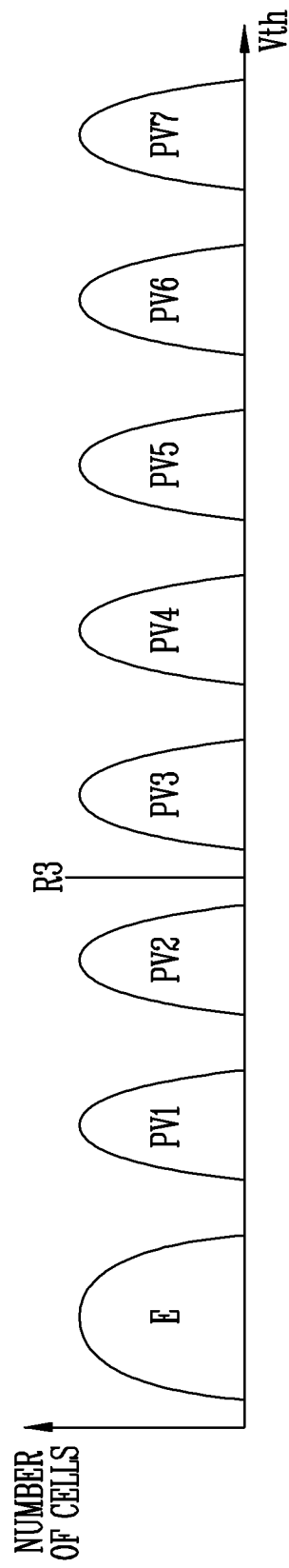

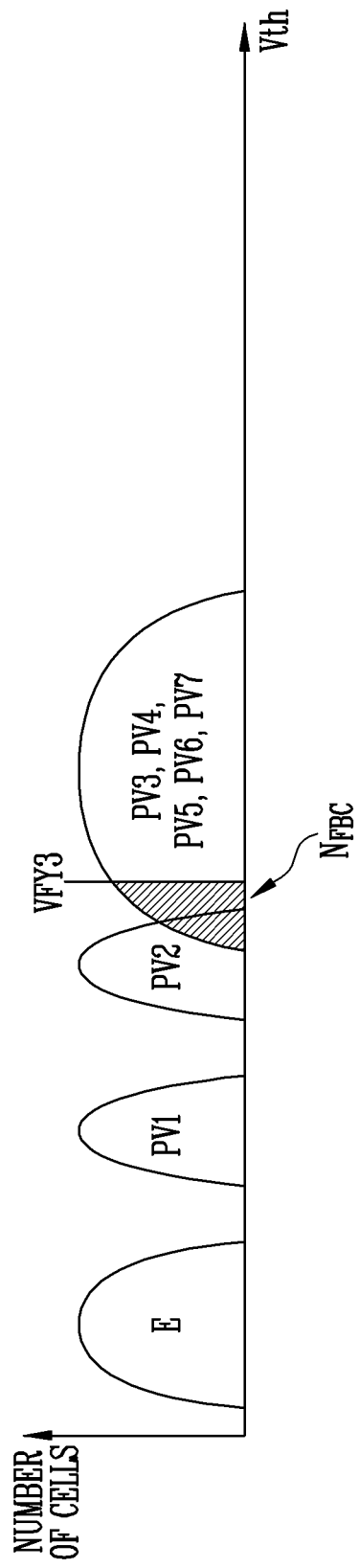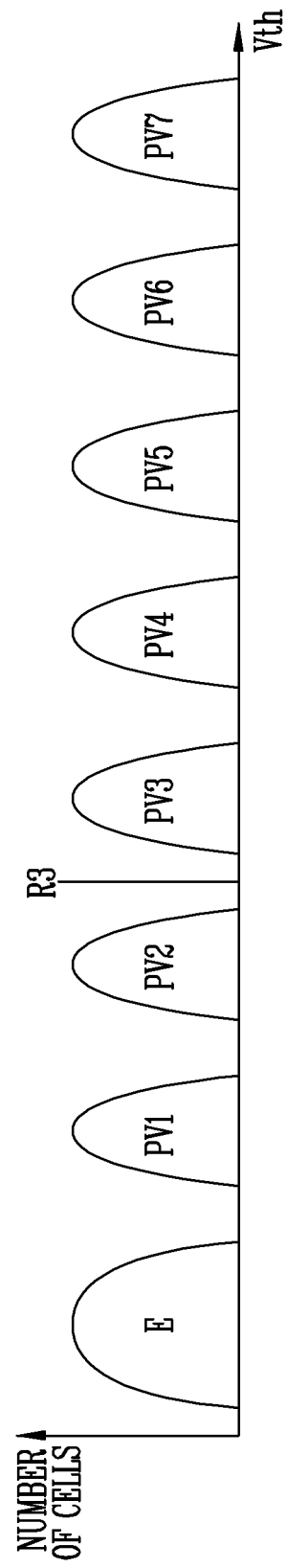

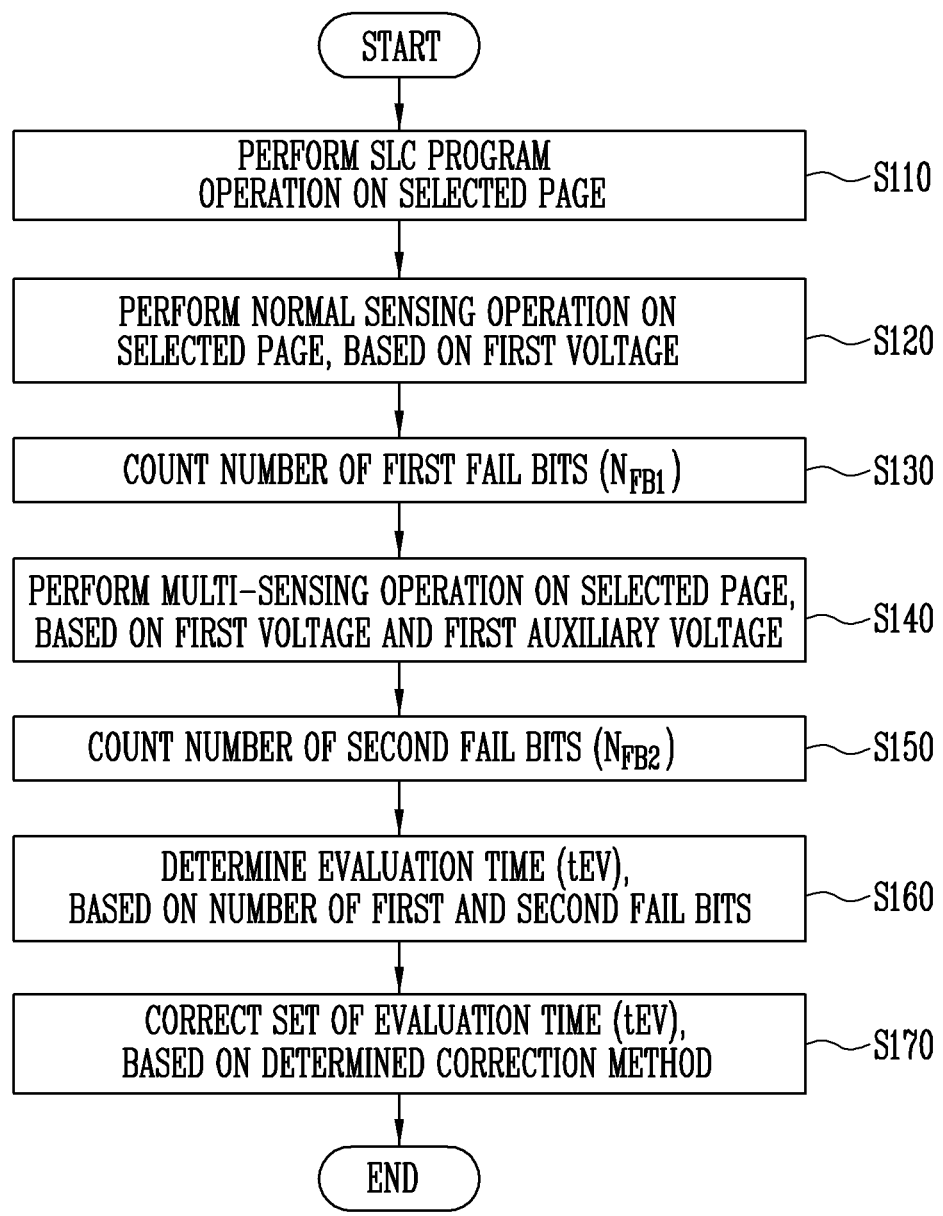

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0149655, filed on Nov. 10, 2020, which is incorporated herein by reference in its entirety.

BACKGROUND

Field of Invention

The present disclosure relates to an electronic device, and more particularly, to a semiconductor memory device and a method of operating the same.

Description of Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional semiconductor memory device is a memory device designed in order to overcome a limitation of integration degree of a two-dimensional semiconductor memory device, and includes a plurality of memory cells that are vertically stacked on a semiconductor substrate.

SUMMARY

Embodiments of the present disclosure provide a semiconductor memory device capable of improving read performance and a method of operating the same.

According to an embodiment of the present disclosure, a semiconductor memory device includes a memory cell array, a peripheral circuit, and a control logic. The memory cell array includes a plurality of memory cells. The peripheral circuit is configured to perform a program operation and a read operation on the memory cell array. The control logic is configured to control an operation of the peripheral circuit. The control logic controls the peripheral circuit to perform a single-level cell (SLC) program operation on memory cells included in a selected page among the plurality of memory cells, compares the number of first fail bits with the number of second fail bits, the first fail bits determined by performing a normal sensing operation on the selected page and the second fail bits determined by performing a multi-sensing operation on the selected page, and corrects at least one evaluation time to be used for a read operation based on a result of the comparison.

According to another embodiment of the present disclosure, a method of operating a semiconductor memory device including a plurality of memory cells includes performing a single-level cell (SLC) program operation on selected memory cells among the plurality of memory cells, performing a normal sensing operation on the selected memory cells based on a first voltage and an auxiliary voltage less than the first voltage, determining the number of first fail bits according to the normal sensing operation, performing a multi-sensing operation on the selected memory cells based on the first voltage, determining the number of second fail bits according to the multi-sensing operation, and determining a correction method of at least one evaluation time used for a read operation based on the number of the first fail bits and the number of the second fail bits.

According to still another embodiment of the present disclosure, a semiconductor memory device includes a memory cell array and a control logic. The memory cell array includes a plurality of memory cells. The control logic is configured to perform a program operation on memory cells that are included in a selected page among the plurality of memory cells, determine first fail bits by performing a normal sensing operation on the selected page, determine second fail bits by performing a multi-sensing operation on the selected page, compare the number of first fail bits with the number of second fail bits, adjust at least one evaluation time for one or more read voltages associated with a read operation based on the comparison result and a bit line sensing scheme, and perform the read operation on the selected page based on the adjusted evaluation time.

The present technology may provide a semiconductor memory device capable of improving read performance and a method of operating the same.

BRIEF DESCRIPTION OF THE DRAWINGS

FIGS. 7A and 7B are diagrams illustrating voltage compensation in a verify operation of an all bit line sensing method and a subsequent read operation according to an embodiment of the present disclosure.

FIGS. 9A and 9B are diagrams illustrating voltage compensation in a verify operation of a select bit line sensing method and a subsequent read operation according to an embodiment of the present disclosure.

FIG. 11 is a flowchart illustrating a method of operating a semiconductor memory device according to an embodiment of the present disclosure.

DETAILED DESCRIPTION

Specific structural or functional descriptions of embodiments according to the concepts which are disclosed in the present specification or application are illustrated only to describe the embodiments according to the concepts of the present disclosure. The embodiments according to the concept of the present disclosure may be carried out in various forms and the descriptions are not limited to the embodiments described in the present specification or application.

Figure 1:
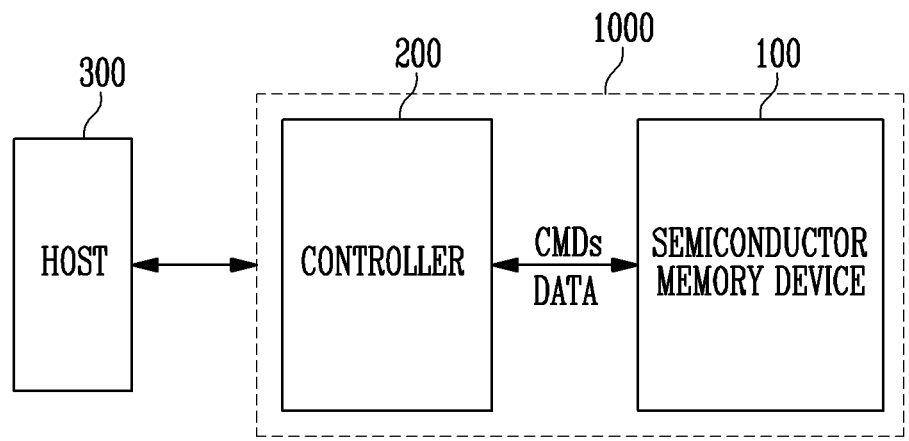
FIG. 1 is a block diagram illustrating a memory system including a controller and a semiconductor memory device according to an embodiment of the present disclosure.

FIG. 1 is a block diagram illustrating a memory system 1000 including a controller 200 and a semiconductor memory device 100 according to an embodiment of the present disclosure.

Referring to FIG. 1, the memory system 1000 includes the semiconductor memory device 100 and the controller 200. The memory system 1000 communicates with a host 300. The controller 200 controls an overall operation of the semiconductor memory device 100 by transferring commands CMDs based on requests received from the host 300. The controller 200 transfers data DATA corresponding to each of the commands CMDs to the semiconductor memory device 100 or receives the data DATA from the semiconductor memory device 100. For example, when a program request and program data are received from the host 300, the controller 200 transfers a program command and program data corresponding thereto to the semiconductor memory device 100. In another example, when a read request is received from the host 300, the controller 200 transfers a read command corresponding thereto to the semiconductor memory device 100. Thereafter, the semiconductor memory device 100 transfers read data corresponding to the read command to the controller 200.

When the memory system 1000 switches from a turn-off state to a turn-on state, a booting operation of the memory system 1000 may be performed. The booting operation of the memory system 1000 may include an operation of scanning a current state of a plurality of memory blocks included in the semiconductor memory device 100 and storing the scanned state of each of the memory blocks in a memory inside the controller 200. For example, a plurality of memory blocks included in the semiconductor memory device 100 may be in one of an erase state (or erased state), a program state (or programmed state), and an open state (or opened state). When data is not stored in all physical pages included in the memory block and all cells included in the corresponding memory block are in the erase state, the corresponding memory block is in the erase state. When data is stored in all physical pages included in the memory block, the memory block is in the program state. When data is stored in some of the physical pages included in the memory block and data is not stored in some physical pages, the corresponding memory block is in the open state. A state of a corresponding memory block may be determined by sequentially reading data of pages included in the memory block. To this end, the controller 200 may generate a plurality of read commands for reading the data of the pages included in the memory block and transfer the plurality of read commands to the semiconductor memory device 100. The semiconductor memory device 100 may perform a read operation corresponding to the received read command, and transfers data read as a result of the read operation to the controller 200.

Figure 2:
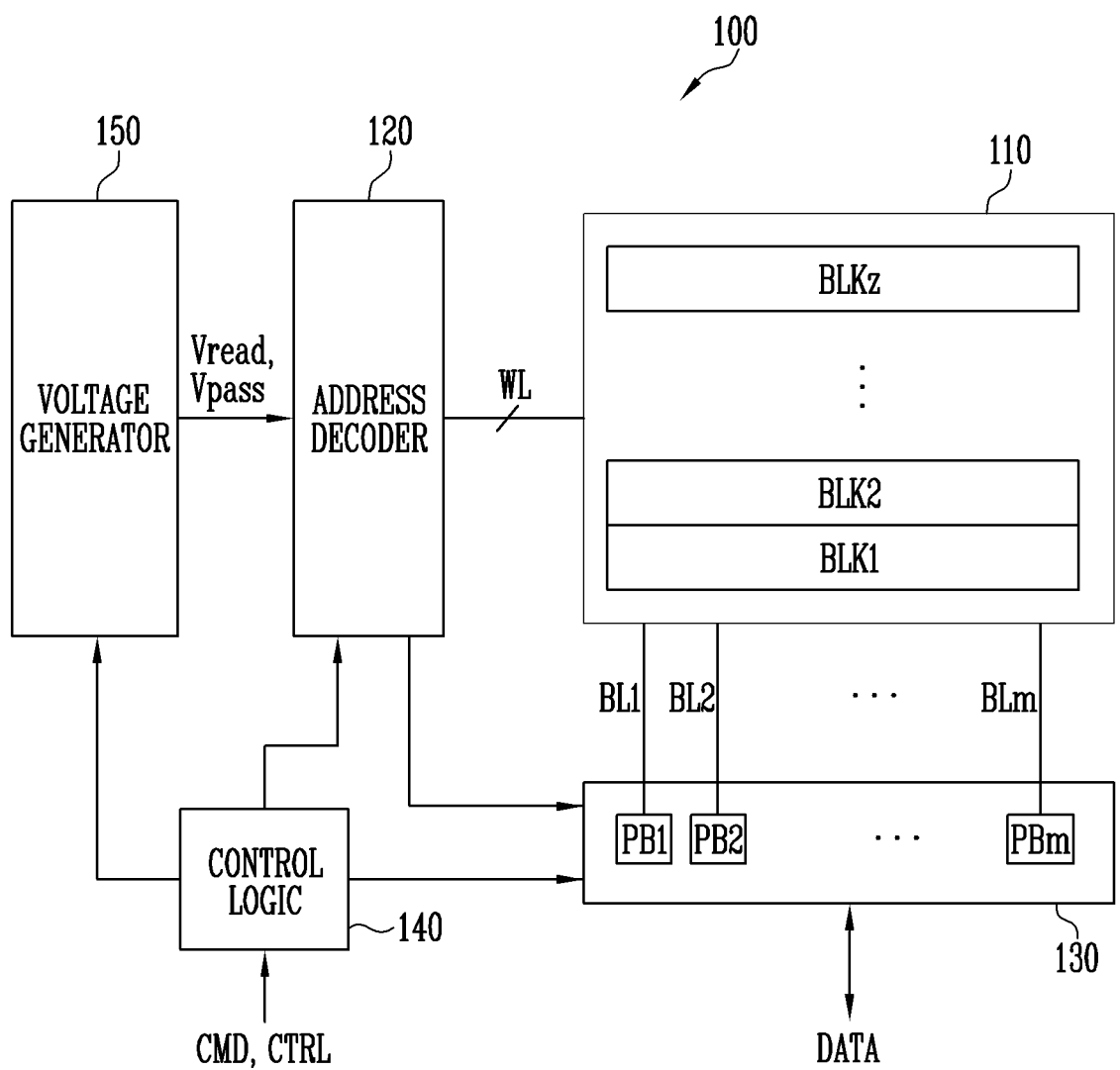
FIG. 2 is a block diagram illustrating the semiconductor memory device of FIG. 1 according to an embodiment of the present disclosure.

FIG. 2 is a block diagram illustrating the semiconductor memory device 100 of FIG. 1 according to an embodiment of the present disclosure.

Referring to FIG. 2, the semiconductor memory device 100 includes a memory cell array 110, an address decoder 120, a read and write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell (TLC) storing three bits of data. In still another embodiment, each of the plurality of memory cells included in the memory cell array 110 may be a quad-level cell (QLC) storing four bits of data. According to an embodiment, the memory cell array 110 may include a plurality of memory cells each storing five or more bits of data.

The address decoder 120, the read and write circuit 130, and the voltage generator 150 operate as a peripheral circuit that drives the memory cell array 110. At this time, the peripheral circuit operates under control of the control logic 140. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150, to a selected word line of the selected memory block at a time of a read voltage application operation during a read operation, and applies a pass voltage Vpass to the remaining unselected word lines. In addition, during a program verify operation, the address decoder 120 applies a verify voltage generated by the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130. A plurality of memory cells connected to one word line may configure one physical page. When each of the plurality of memory cells included in the semiconductor memory device is a single-level cell (SLC) storing one bit, one logical page data may be stored in one physical page. When each of the plurality of memory cells included in the semiconductor memory device is a multi-level cell (MLC) storing two bits, two logical page data, for example, most significant bit (MSB) page data and least significant bit (LSB) page data may be stored in one physical page. When each of the plurality of memory cells included in the semiconductor memory device is a triple-level cell (TLC) storing three bits, three logical page data, for example, MSB page data, a central significant bit (CSB) page data and LSB page data may be stored in one physical page. When each of the plurality of memory cells included in the semiconductor memory device is a quad-level cell (QLC) storing four bits, four logical page data, for example, MSB page data, high central significant bit (HCSB) page data, low central significant bit (LCSB) page data, and LSB page data may be stored in one physical page.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells. Further, the plurality of page buffers PB1 to PBm latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column select circuit, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node pre-charge potential level of the plurality of page buffers PB1 to PBm. The control logic 140 may control the read and write circuit 130 to perform the read operation of the memory cell array 110. The control logic 140 controls the voltage generator 150 to generate various voltages used during the program operation of the memory cell array 110. In addition, the control logic 140 controls the address decoder 120 to transfer the voltages generated by the voltage generator 150 to local lines of a memory block to be operated through global lines. During the read operation, the control logic 140 controls the read and write circuit 130 to read data of a selected page of the memory block through the bit lines BL1 to BLm and store the data in the page buffers PB1 to PBm. During the program operation, the control logic 140 controls the read and write circuit 130 to program the data stored in the page buffers PB1 to PBm in the selected page.

During the read operation, the voltage generator 150 generates the read voltage Vread and the pass voltage Vpass in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 3:
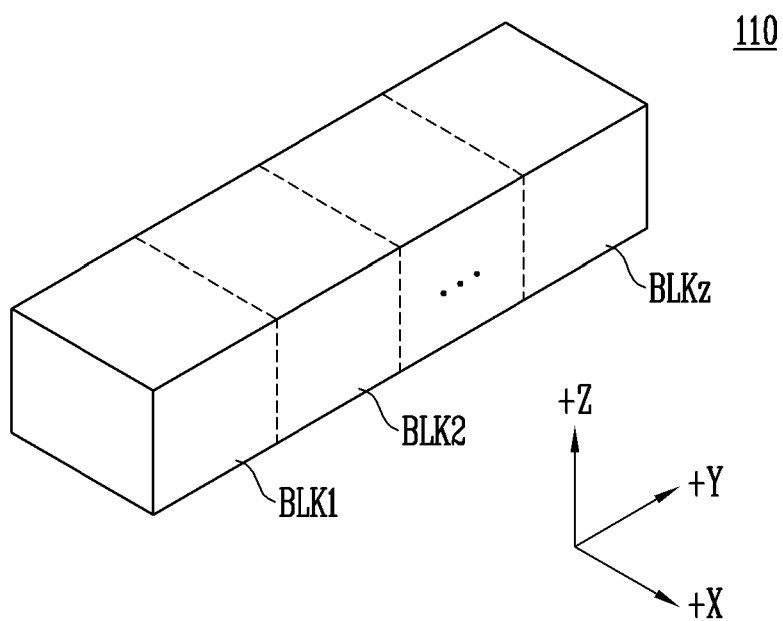
FIG. 3 is a block diagram illustrating a memory cell array 110 of FIG. 2 according to an embodiment of the present disclosure.

FIG. 3 is a block diagram illustrating the memory cell array 110 of FIG. 2 according to an embodiment of the present disclosure.

Referring to FIG. 3, the memory cell array 110 includes a plurality of memory blocks BLK1 to BLKz. Each memory block has a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 3 and 4.

Figure 4:
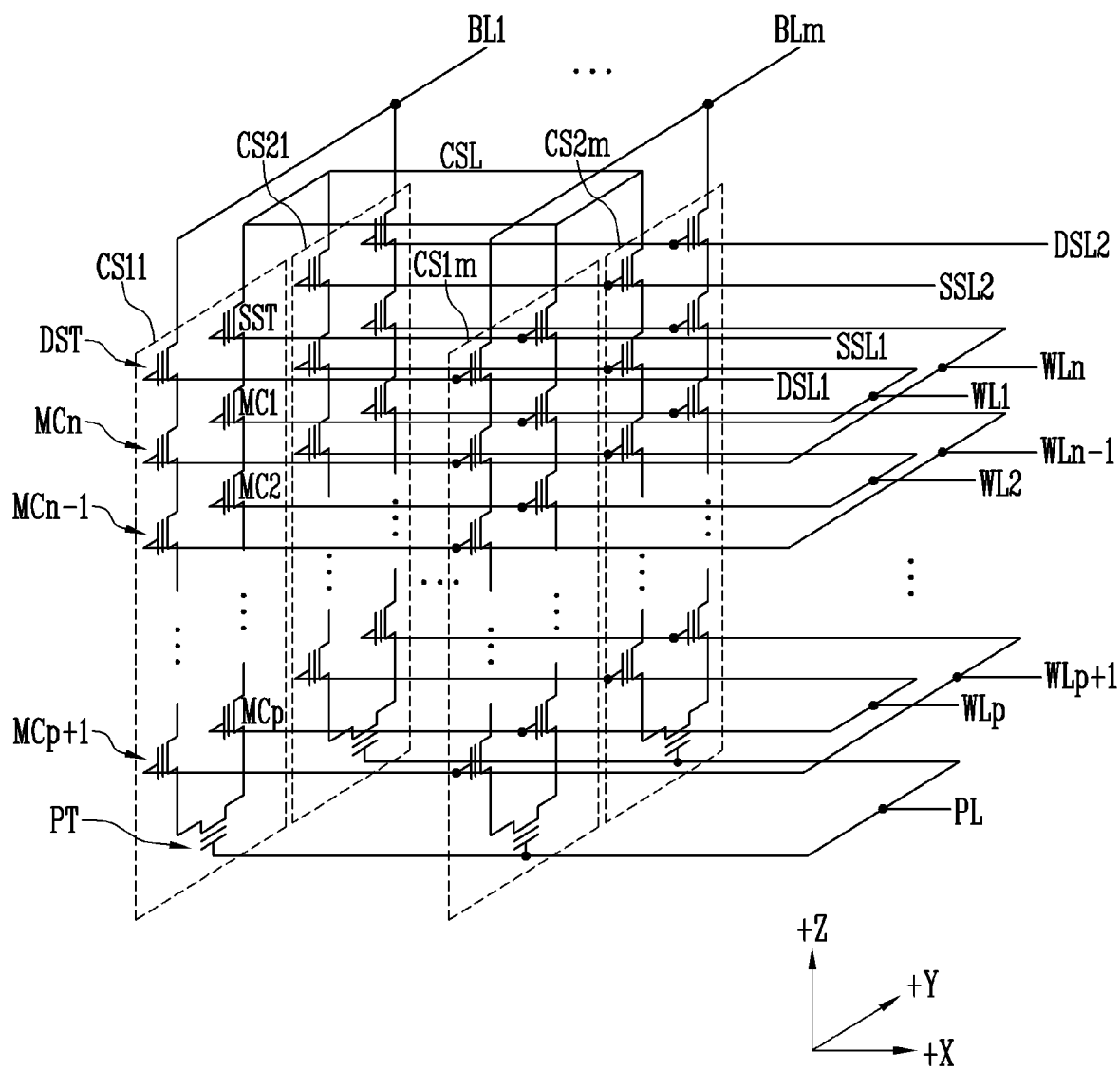
FIG. 4 is a circuit diagram illustrating one memory block BLKa among memory blocks BLK1 to BLKz of FIG. 3 according to an embodiment of the present disclosure.

FIG. 4 is a circuit diagram illustrating one memory block BLKa among the memory blocks BLK1 to BLKz of FIG. 3 according to an embodiment of the present disclosure.

Referring to FIG. 4, the memory block BLKa includes a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (that is, the +X direction). In FIG. 4, by way of example, two cell strings are arranged in a column direction (that is, the +Y direction). However, it may be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1$m$ of a first row are connected to a first source select line SSL1. The source select transistors of the cell strings CS21 to CS2$m$ of a second row are connected to a second source select line SSL2.

In another embodiment, the source select transistors of the cell strings CS11 to CS1$m$ and CS21 to CS2$m$ may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1$m$ of the first row are connected to a first drain select line DSL1. The drain select transistors of the cell strings CS21 to CS2$m$ of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1$m$ and CS2$m$ of the m-th column are connected to the m-th bit line BLm.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting one of the drain select lines DSL1 and DSL2. One page of the selected cell strings may be selected by selecting one of the word lines WL1 to WLn.

In another embodiment, even bit lines and odd bit lines may be provided instead of the first to m-th bit lines BL1 to BLm. In addition, even-numbered cell strings among the cell strings CS11 to CS1$m$ or CS21 to SC2$m$ arranged in the row direction may be connected to even the bit lines, respectively and odd-numbered cell strings among the cell strings CS11 to CS1$m$ or CS21 to CS2$m$ arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
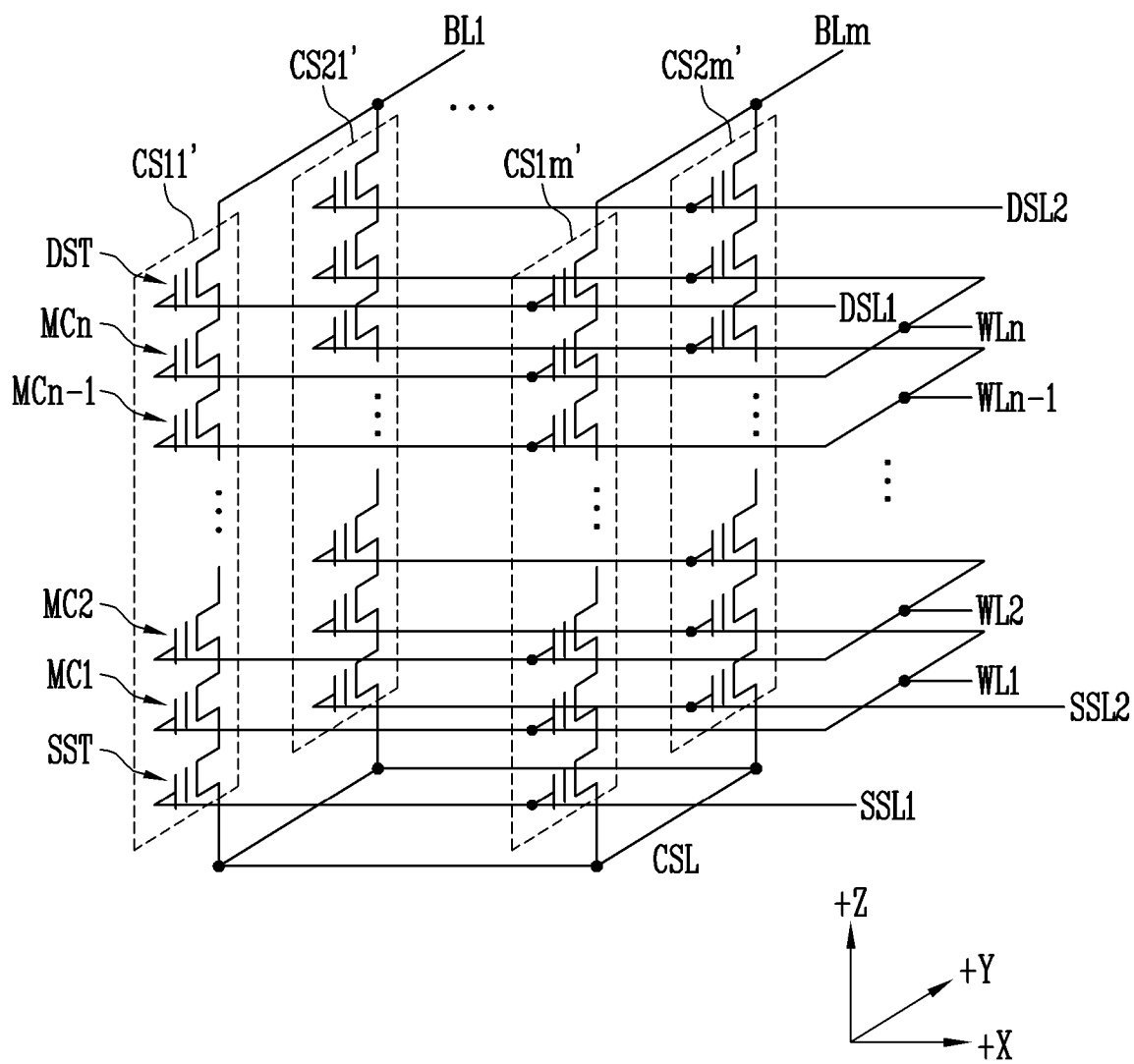
FIG. 5 is a circuit diagram illustrating another memory block BLKb among the memory blocks BLK1 to BLKz of FIG. 3 according to an embodiment of the present disclosure.

FIG. 5 is a circuit diagram illustrating another memory block BLKb among the memory blocks BLK1 to BLKz of FIG. 3 according to an embodiment of the present disclosure.

Referring to FIG. 5, the memory block BLKb includes a plurality of cell strings CS11' to CS1$m$' and CS21' to CS2$m$'. Each of the plurality of cell strings CS11' to CS1$m$' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, respectively, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
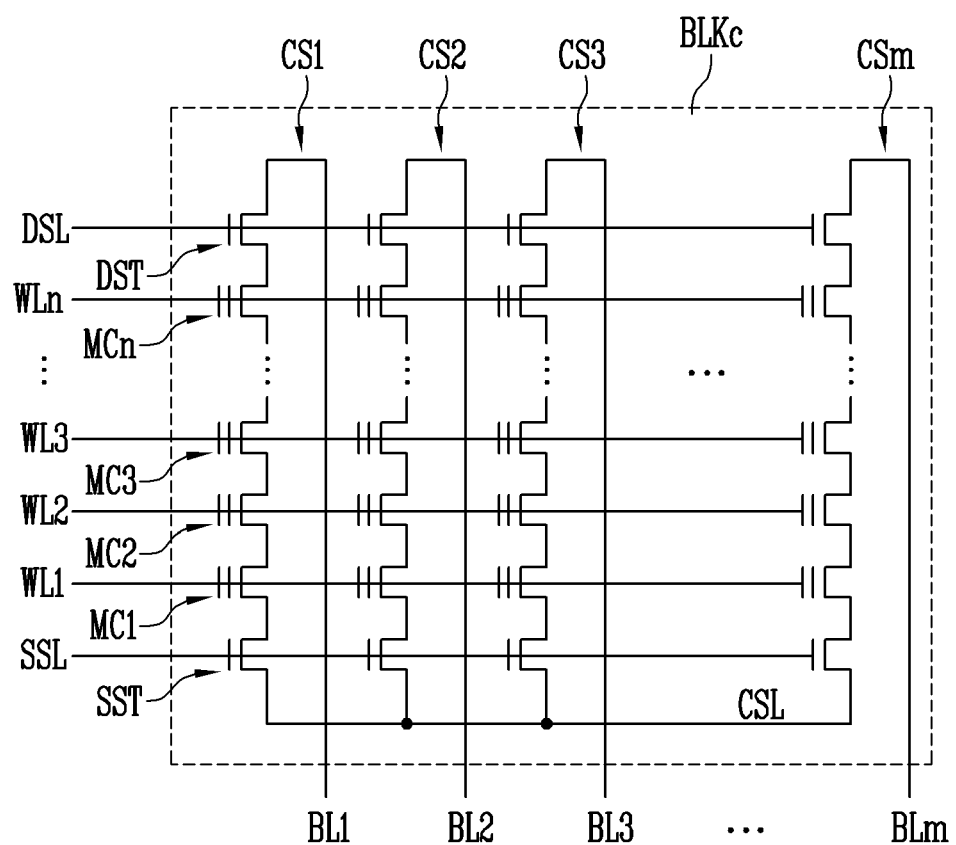
FIG. 6 is a circuit diagram illustrating one memory block BLKc among the memory blocks BLK1 to BLKz included in the memory cell array 110 of FIG. 2 according to an embodiment of the present disclosure.

FIG. 6 is a circuit diagram illustrating a memory block BLKc among the memory blocks BLK1 to BLKz included in the memory cell array 110 of FIG. 2 according to an embodiment of the present disclosure.

Referring to FIG. 6, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

As shown in FIGS. 3 to 5, the memory cell array 110 of the semiconductor memory device 100 may be configured as a memory cell array of a three-dimensional structure. In addition, as shown in FIG. 6, the memory cell array 110 of the semiconductor memory device 100 may be configured as a memory cell array of a two-dimensional structure.

FIGS. 7A and 7B are diagrams illustrating voltage compensation in a verify operation of an all bit line sensing method and a subsequent read operation according to an embodiment of the present disclosure.

Referring to FIG. 7A, a threshold voltages distribution of memory cells in a state in which a program operation is in progress is shown. In FIG. 7A, each of the memory cells is a TLC capable of storing three bits. Therefore, when the program operation is completed, a threshold voltage of each of the memory cells may have one of an erase state E or first to seventh program states PV1 to PV7. FIG. 7A shows a situation in which a verify operation for the third program state PV3 is performed in a state in which program for the first and second program states PV1 and PV2 is completed and program for the third to seventh program states PV3 to PV7 is not completed during the program operation. In order to perform the verify operation for the third program state PV3, a third verify voltage VFY3 may be applied to the selected word line.

In FIG. 7A, all bit lines are precharged during the verify operation. That is, in a process of verifying whether program of the memory cells to be programmed to the third program state PV3 is completed, not only the memory cells to be programmed to the third program state PV3 but also all bit lines connected to the remaining memory cells are precharged together.

Referring to FIG. 7B, a situation in which a third read voltage R3 is applied for the read operation after the program operation is completed is shown. As the third read voltage is applied, memory cells having a threshold voltage lower than the third read voltage and memory cells having a threshold voltage higher than the third read voltage are divided. That is, due to the application of the third read voltage, the memory cells belonging to one of the erase state E and the first and second program states PV1 and PV2, and the memory cells belonging to the third to seventh program states PV3 to PV7 are divided.

Comparing FIGS. 7A and 7B, the threshold voltage distribution of the memory cells during the verify operation is different from the threshold voltage distribution of the memory cells after completion of the program. That is, since a threshold voltage state of the memory cells in the verify operation is different from the threshold voltage state of the memory cells in the read operation, a difference of a reference current used for a sensing operation may occur. For example, since most of the memory cells are in a relatively low threshold voltage state during the verify operation for the first program state PV1, a difference from the threshold voltage distribution of the memory cells in a state in which the program is completed is considerably large. On the other hand, during the verify operation for the seventh program state PV7, since distribution formation of the memory cells in the erase state E and the first to sixth program states PV1 to PV6 is completed, the difference from the threshold voltage distribution of the memory cells in a state in which the program is completed is small. Accordingly, an evaluation time in the sensing operation corresponding to each program state needs to be individually compensated during the read operation.

Figure 8A:
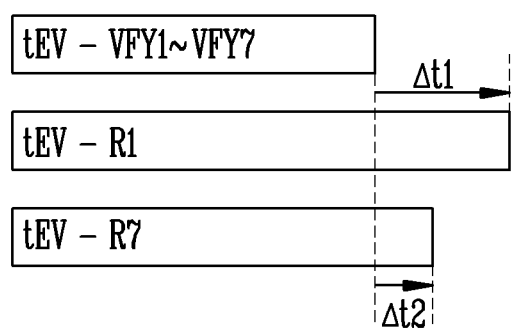
FIGS. 8A and 8B are diagrams illustrating an evaluation time correction method in a case where an effect of lowering a reference current is dominant and an effect of source line noise is dominant during verification using an all bit line sensing method according to an embodiment of the present disclosure.
Figure 8B:
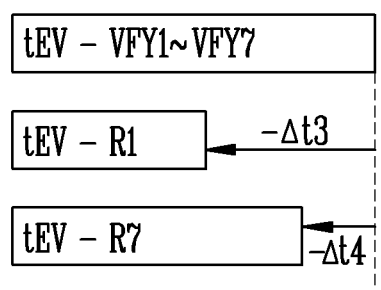

FIGS. 8A and 8B are diagrams illustrating an evaluation time correction method in a case where an effect of lowering a reference current is dominant and an effect of source line noise is dominant during verification using an all bit line sensing method according to an embodiment of the present disclosure.

Referring to FIG. 8A, when the all bit line sensing method is used, the evaluation time correction method in a case where the effect of lowering the reference current is more dominant than the effect of the source line noise, is shown. In a case where the effect of lowering the reference current is more dominant than the effect of the source line noise, the evaluation time may be increased generally in the read operation than the evaluation time used during the verify operation. In this case, when verifying the first program state PV1, since the threshold voltage distribution state of the memory cells has the largest difference from the threshold voltage distribution state after the program, an increase width of the evaluation time during the sensing operation using a first read voltage is set to be the largest, and conversely, an increase width of the evaluation time during the sensing operation using a seventh read voltage is set to be the smallest. That is, the evaluation time {tEV–R1} corresponding to the first read voltage R1 becomes a value obtained by increasing the evaluation time {tEV–VFY1 to VFY7} used during the verify operation by a first time width Δt1. Moreover, the evaluation time {tEV–R7} corresponding to the seventh read voltage R7 becomes a value obtained by increasing the evaluation time {tEV–VFY1 to VFY7} used during the verify operation by a second time width Δt2. Here, the first time width Δt1 is a value greater than the second time width Δt2.

In FIG. 8A, by way of example, only the evaluation time of the sensing operation using the first read voltage R1 and the evaluation time of the sensing operation using the seventh read voltage R7 are shown, but evaluation times corresponding to the second to sixth read voltages may be applied in a sequentially decreasing size between the evaluation times corresponding to the first and seventh read voltages.

Referring to FIG. 8B, when the all bit line sensing method is used, an evaluation time correction method of a case where the effect of the source line noise is more dominant than the effect of lowering the reference current, is shown. When the effect of the source line noise is more dominant than the effect of lowering the reference current, the evaluation time may be decreased generally in the read operation than the evaluation time used during the verify operation. In this case, a decrease width of the evaluation time during the sensing operation using the first read voltage R1 is set to be the largest, and conversely, a decrease width of the evaluation time during the sensing operation using the seventh read voltage R7 is set to be the smallest. That is, the evaluation time {tEV–R1} corresponding to the first read voltage R1 becomes a value obtained by decreasing the evaluation time {tEV–VFY1 to VFY7} used during the verify operation by a third time width Δt3. Moreover, the evaluation time {tEV–R7} corresponding to the seventh read voltage R7 becomes a value obtained by decreasing the evaluation time {tEV–VFY1 to VFY7} used during the verify operation by a fourth time width Δt4. Here, the third time width Δt3 is a value greater than the fourth time width Δt4.

FIGS. 9A and 9B are diagrams illustrating voltage compensation in a verify operation of a select bit line sensing method and a subsequent read operation according to an embodiment of the present disclosure.

Referring to FIG. 9A, a threshold voltages distribution of memory cells in a state in which a program operation is in progress is shown. In FIG. 9A, each of the memory cells is a TLC capable of storing three bits. Therefore, when the program operation is completed, a threshold voltage of each of the memory cells may have one of an erase state E or first to seventh program states PV1 to PV7. By way of example, FIG. 9A shows a situation in which a verify operation for the third program state PV3 is performed in a state in which program for the first and second program states PV1 and PV2 is completed and program for the third to seventh program states PV3 to PV7 is not completed during the program operation. In order to perform the verify operation for the third program state PV3, a third verify voltage VFY3 may be applied to the selected word line.

In FIG. 9A, only selected bit lines are precharged during the verify operation. That is, in a process of verifying whether program of the memory cells to be programmed to the third program state PV3 is completed, all bit lines respectively connected to cells on which program is not completed among the memory cells to be programmed to the third program state PV3 are precharged together. In FIG. 9A, a hatched portion indicates the number of fail bit cells $N_{FBC}$ the cells on which the program is not completed among the memory cells to be programmed to the third program state PV3.

Referring to FIG. 9B, similarly to FIG. 7B, a situation in which a third read voltage R3 is applied for the read operation after the program operation is completed is shown. As the third read voltage R3 is applied, memory cells having a threshold voltage lower than the third read voltage and memory cells having a threshold voltage higher than the third read voltage are divided. That is, due to the application of the third read voltage R3, memory cells are divided into the memory cells belonging to one of the erase state E and the first and second program states PV1 and PV2, and the memory cells belonging to the third to seventh program states PV3 to PV7.

Comparing FIGS. 9A and 9B, the threshold voltage distribution of the memory cells during the verify operation is different from the threshold voltage distribution of the memory cells after completion of the program. That is, since a threshold voltage state of the memory cells in the verify operation is different from the threshold voltage state of the memory cells in the read operation, a difference of a reference current used for a sensing operation may occur. Accordingly, an evaluation time in the sensing operation corresponding to each program state needs to be individually compensated during the read operation.

Figure 10A:
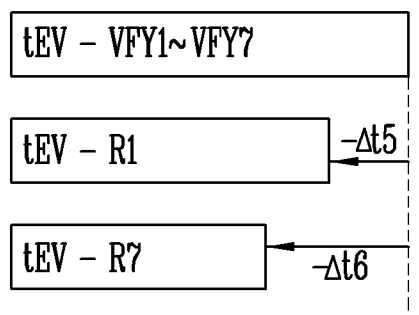
FIGS. 10A and 10B are diagrams illustrating an evaluation time correction method in a case where an effect of lowering a reference current is dominant and an effect of source line noise is dominant during verification using a select bit line sensing method according to an embodiment of the present disclosure.
Figure 10B:
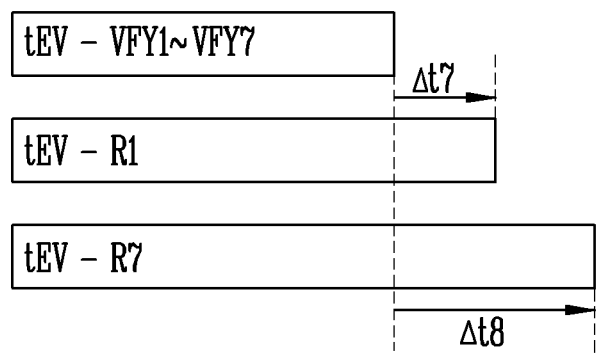

FIGS. 10A and 10B are diagrams illustrating an evaluation time correction method in a case where an effect of lowering a reference current is dominant and an effect of source line noise is dominant during verification using a select bit line sensing method according to an embodiment of the present disclosure.

Referring to FIG. 10A, when the select bit line sensing method is used, the evaluation time correction method in a case where the effect of lowering the reference current is more dominant than the effect of the source line noise, is shown. In a case where the effect of lowering the reference current is more dominant than the effect of the source line noise, the evaluation time may be decreased generally in the read operation than the evaluation time used during the verify operation. In this case, a decrease width of the evaluation time during the sensing operation using a first read voltage R1 is set to be the smallest, and conversely, a decrease width of the evaluation time during the sensing operation using a seventh read voltage R7 is set to be the largest. That is, the evaluation time {tEV–R1} corresponding to the first read voltage R1 becomes a value obtained by decreasing the evaluation time {tEV–VFY1 to VFY7} used during the verify operation by a fifth time width Δt5. Moreover, the evaluation time {tEV–R7} corresponding to the seventh read voltage R7 becomes a value obtained by decreasing the evaluation time {tEV–VFY1 to VFY7} used during the verify operation by a sixth time width Δt6. Here, the fifth time width Δt5 is a value less than the sixth time width Δt6.

Referring to FIG. 10B, when the select bit line sensing method is used, an evaluation time correction method of a case where the effect of the source line noise is more dominant than the effect of lowering the reference current, is shown. When the effect of the source line noise is more dominant than the effect of lowering the reference current, the evaluation time may be increased generally in the read operation than the evaluation time used during the verify operation. In this case, an increase width of the evaluation time during the sensing operation using the first read voltage R1 is set to be the smallest, and conversely, an increase width of the evaluation time during the sensing operation using the seventh read voltage R7 is set to be the largest. That is, the evaluation time {tEV–R1} corresponding to the first read voltage R1 becomes a value obtained by increasing the evaluation time {tEV–VFY1 to VFY7} used during the verify operation by a seventh time width Δt7. Moreover, the evaluation time {tEV–R7} corresponding to the seventh read voltage R7 becomes a value obtained by increasing the evaluation time {tEV–VFY1 to VFY7} used during the verify operation by an eighth time width Δt8. Here, the seventh time width Δt7 is a value less than the eighth time width Δt8.

FIG. 11 is a flowchart illustrating a method of operating a semiconductor memory device according to an embodiment of the present disclosure.

Referring to FIG. 11, the method of operating the semiconductor memory device includes performing an SLC program operation on a selected page (S110), performing a normal sensing operation on the selected page based on a first voltage (S120), counting the number of first fail bits $N_{FB1}$ (S130), performing a multi-sensing operation on the selected page based on the first voltage and a first auxiliary voltage (S140), counting the number of second fail bits $N_{FB2}$ (S150), determining an evaluation time tEV correction method to be used during a read operation based on the number of first and second fail bits (S160), and correcting a set of an evaluation time tEV for the read operation based on the determined correction method (S170).

In operation S110, the SLC program operation is performed on the selected page. This is a program operation to test whether the effect of lowering the reference current is more dominant or the effect of the source line noise is more dominant during the read operation on a corresponding page.

In operation S120, the normal sensing operation is performed on the selected page on which the SLC program operation is performed, based on the first voltage. The normal sensing operation may be an operation of sensing the threshold voltage of each of the memory cells once in a state in which the first voltage is applied to the word line connected to the selected page.

In operation S130, the number of first fail bits $N_{FB1}$ is counted as a result of the normal sensing operation based on the first voltage. The number of first fail bits $N_{FB1}$ may mean the number of memory cells of which the threshold voltage is lower than the first voltage as a result of the normal sensing operation among the memory cells included in the selected page.

In operation S140, the multi-sensing operation is performed on the selected page based on the first voltage and the first auxiliary voltage. The multi-sensing operation may be an operation of first sensing the threshold voltage of each of the memory cells in a state in which the first auxiliary voltage smaller than the first voltage is applied to the word line connected to the selected page and then secondary sensing the threshold voltage of the memory cells by applying the first voltage to the word line connected to the selected page once again. At this time, in the second sensing operation using the first voltage, the sensing operation is not performed on memory cells determined as an on-cell in the first sensing operation. Accordingly, erase cell noise may be suppressed as much as possible during the second sensing operation. The multi-sensing operation is described in more detail with reference to FIGS. 17A to 18B.

In operation S150, the number of second fail bits $N_{FB2}$ is counted as a result of the multi-sensing operation based on the first voltage and the first auxiliary voltage. The number of second fail bits $N_{FB2}$ may mean the number of memory cells of which the threshold voltage is lower than the first voltage as a result of the multi-sensing operation among the memory cells included in the selected page.

In operation S160, the evaluation time tEV correction method is determined based on the number of first fail bits $N_{FB1}$ and the number of second fail bits $N_{FB2}$. A detailed embodiment of operation S160 is described later with reference to FIG. 13.

In operation S170, the set of the evaluation time tEV for the read operation is corrected based on the determined correction method. In a case of the TLC, since the number of read voltages is a total of seven, the evaluation time tEV for the read operation may be individually determined with respect to the seven read voltages R1 to R7. That is, the set of the evaluation time tEV may include seven evaluation times. Thereafter, in the read operation, the sensing operation is performed based on the set of the evaluation time tEV corrected by operation S170.

In FIG. 11, operations (S120 and 130) of the normal sensing operation and counting the number of fail bits according thereto are performed first, and then operations (S140 and S150) of the multi-sensing operation and counting the number of fail bits according thereto are performed. However, the present disclosure is not limited thereto. For example, after performing operation S110, operations (S140 and S150) of the multi-sensing operation and counting the number of fail bits according thereto may be performed first, and then operations (S120 and 130) of the normal sensing operation and counting the number of fail bits according thereto may be performed.

Figure 12A:
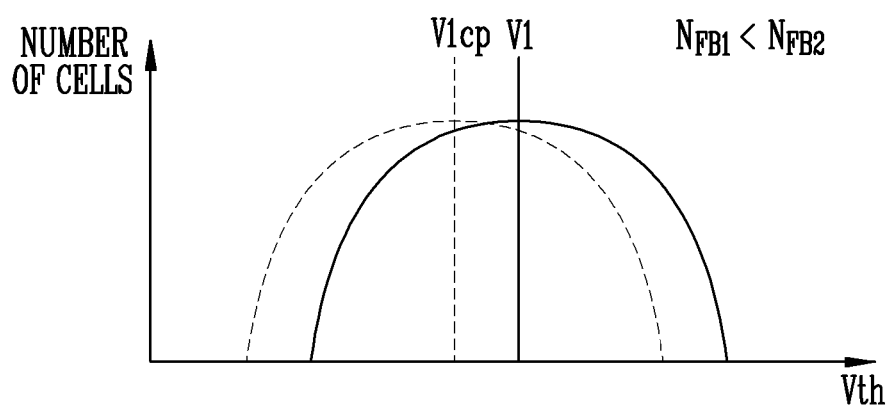
FIGS. 12A and 12B are diagrams illustrating a difference of the number of fail bits in a normal sensing operation and a multi-sensing operation, in a case where an effect of lowering a reference current is dominant in an all bit line sensing method, and in a case where an effect of source line noise is dominant in an all bit line sensing method, respectively, according to an embodiment of the present disclosure.
Figure 12B:
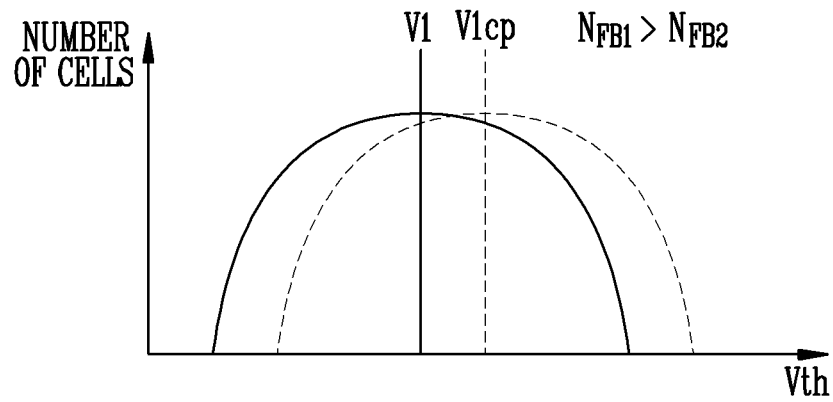

FIG. 12A is a diagram illustrating a difference of the number of fail bits in a normal sensing operation and a multi-sensing operation in a case where an effect of lowering a reference current is dominant in an all bit line sensing method according to an embodiment of the present disclosure. FIG. 12B is a diagram illustrating a difference of the number of fail bits in a normal sensing operation and a multi-sensing operation in a case where an effect of source line noise is dominant in an all bit line sensing method according to an embodiment of the present disclosure.

Referring to FIG. 12A, a threshold voltage distribution resulting from performing the normal sensing operation with a first voltage V1 on an SLC programmed page is shown by a solid line. Moreover, a threshold voltage distribution resulting from performing the multi-sensing operation with the first voltage V1 on the SLC programmed page is shown by a dotted line.

That is, the number of fail bits counted during the normal sensing operation with the first voltage V1, that is, the number of first fail bits $N_{FB1}$, is less than the number of fail bits counted during the multi-sensing operation with the first voltage V1, that is, the number of second fail bits $N_{FB2}$. This means that the threshold voltage distribution observed during the multi-sensing operation with the first voltage V1 is moved to a left side than the threshold voltage distribution observed during the normal sensing operation with the first voltage V1. Therefore, a read voltage used during the multi-sensing operation may be moved to a first compensation voltage $V1_{CP}$ lower than the first voltage V1. This case means that the evaluation time tEV may be increased.

Referring to FIG. 12B, the number of fail bits counted during the normal sensing operation with the first voltage V1, that is, the number of first fail bits $N_{FB1}$, is greater than the number of fail bits counted during the multi-sensing operation with the first voltage V1, that is, the number of second fail bits $N_{FB2}$. This means that the threshold voltage distribution observed during the multi-sensing operation with the first voltage V1 is moved to a right side than the threshold voltage distribution observed during the normal sensing operation with the first voltage V1. Therefore, the read voltage used during the multi-sensing operation may be moved to a first compensation voltage $V1_{CP}$ higher than the first voltage V1. This case means that the evaluation time tEV may be decreased.

Figure 13:
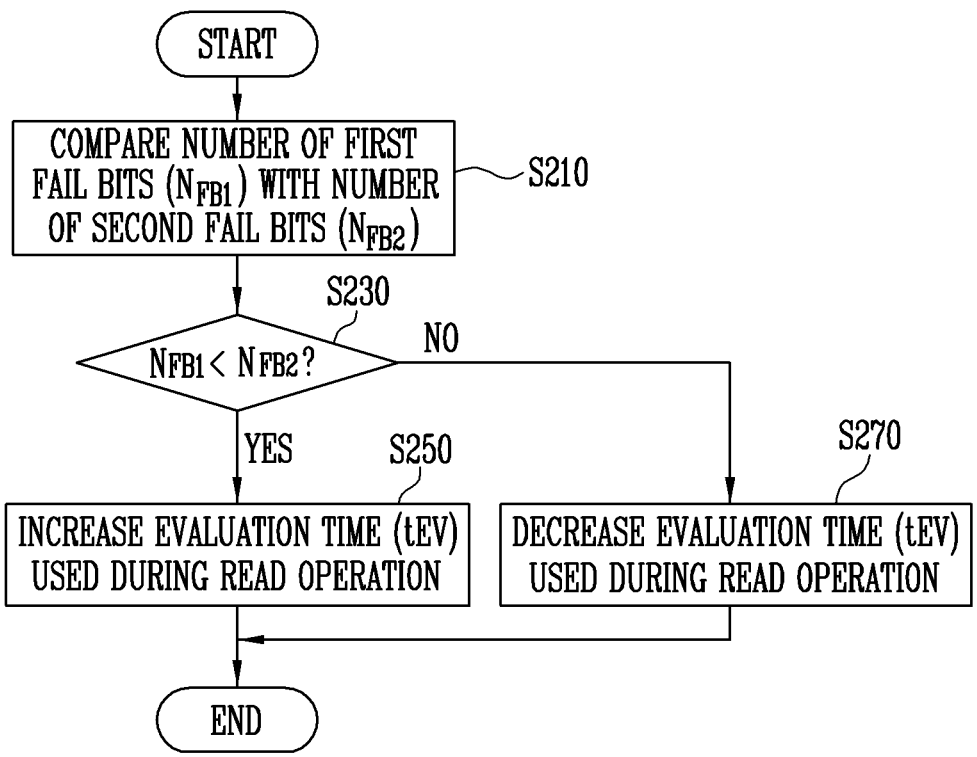
FIG. 13 is a flowchart illustrating an operation S160 of FIG. 11 according to an embodiment of the present disclosure.

FIG. 13 is a flowchart illustrating the operation S160 of FIG. 11 according to an embodiment of the present disclosure. That is, FIG. 13 is an embodiment for determining a correction method of the evaluation time tEV when the verify operation is performed through the all bit line sensing method.

Referring to FIG. 13, operation S160 of FIG. 11 includes comparing the number of first fail bits $N_{FB1}$ with the number of second fail bits $N_{FB2}$ (S210), increasing the evaluation time tEV used during the read operation (S250) when the number of first fail bits $N_{FB1}$ is less than the number of second fail bits $N_{FB2}$ (S230: Yes) or decreasing the evaluation time tEV used during the read operation (S270) when the number of first fail bits $N_{FB1}$ is not less than the number of second fail bits $N_{FB2}$ (S230: No). As described above with reference to FIGS. 12A and 12B, when the number of first fail bits $N_{FB1}$ is less than the number of second fail bits $N_{FB2}$, this means that the threshold voltage distribution observed when reading through the multi-sensing method is moved to the left side. Therefore, the evaluation time is increased to compensate for the read voltage. On the other hand, when the number of first fail bits $N_{FB1}$ is greater than the number of second fail bits $N_{FB2}$, this means that the threshold voltage distribution observed when reading through the multi-sensing method is moved to the right side. Therefore, the evaluation time is decreased to compensate for the read voltage.

Figure 14A:
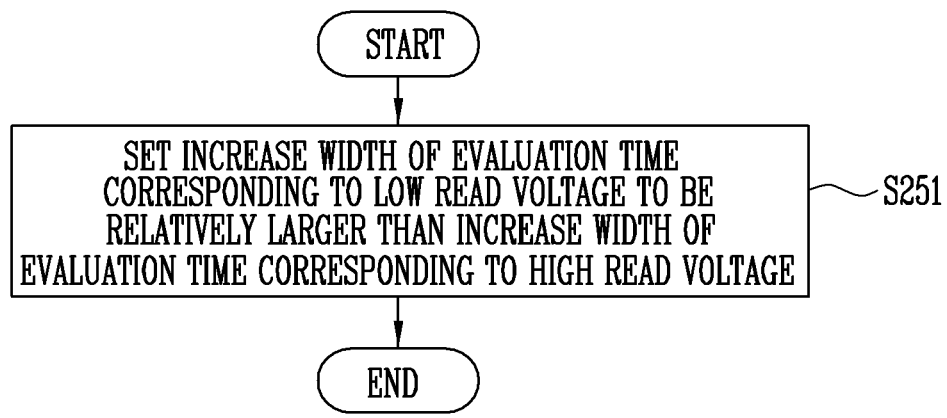
FIGS. 14A and 14B are flowcharts illustrating an operations S250 and S270 of FIG. 13, respectively, according to an embodiment of the present disclosure.
Figure 14B:
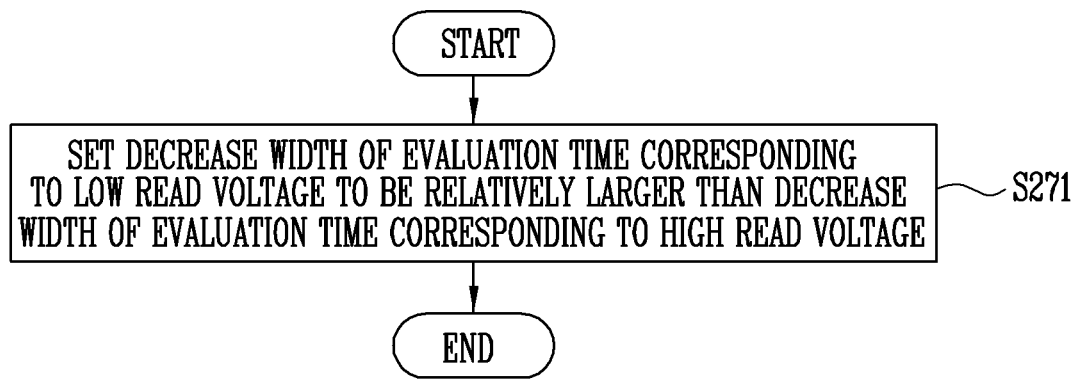

FIGS. 14A and 14B are flowcharts illustrating operations S250 and S270 of FIG. 13, respectively, according to an embodiment of the present disclosure.

Referring to FIG. 14A, increasing the evaluation time tEV used during the read operation in the all bit line sensing method (S250) includes setting an increase width of an evaluation time corresponding to a low read voltage to be relatively larger than an increase width of an evaluation time corresponding to a high read voltage (S251). The fact that the threshold voltage distribution observed when reading in the multi-sensing method is moved to the left side means that the effect of lowering the reference current is more dominant than the effect of the source line noise. Therefore, as described above with reference to FIG. 8A, since the threshold voltage distribution state of the memory cells during verification of the first program state PV1 has the largest difference from the threshold voltage distribution state after the program, the increase width of the evaluation time {tEV−R1} during the sensing operation using the first read voltage R1 is set to be the largest, and conversely, the increase width of the evaluation time {tEV−R7} during the sensing operation using the seventh read voltage R7 is set to be the smallest.

Referring to FIG. 14B, decreasing the evaluation time tEV used during the read operation in the all bit line sensing method (S270) includes setting a decrease width of the evaluation time corresponding to the low read voltage to be relatively larger than a decrease width of the evaluation time corresponding to the high read voltage (S271). The fact that the threshold voltage distribution observed when reading in the multi-sensing method is moved to the right side means that the effect of the source line noise is more dominant than the effect of lowering the reference current. Therefore, as described above with reference to FIG. 8B, since the threshold voltage distribution state of the memory cells during verification of the first program state PV1 has the largest difference from the threshold voltage distribution state after the program, the decrease width of the evaluation time {tEV−R1} during the sensing operation using the first read voltage is set to be the largest, and conversely, the decrease width of the evaluation time {tEV−R7} during the sensing operation using the seventh read voltage is set to be the smallest.

Figure 15:
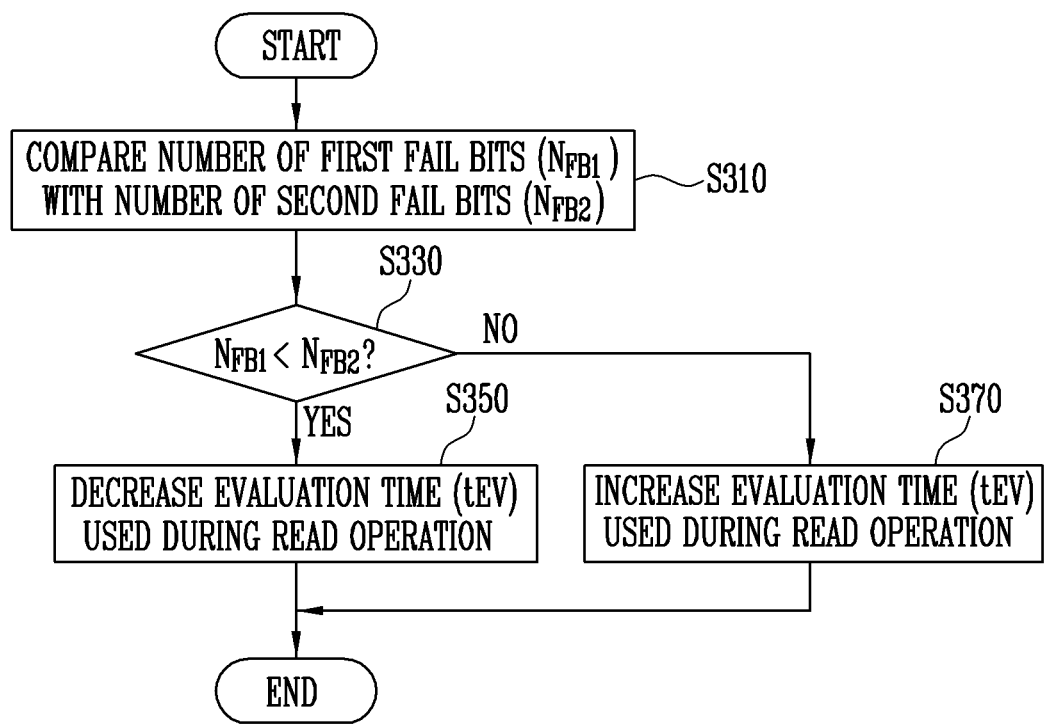
FIG. 15 is a flowchart illustrating another operation S160 of FIG. 11 according to an embodiment of the present disclosure.

FIG. 15 is a flowchart illustrating an operation S160 of FIG. 11 according to an embodiment of the present disclosure. That is, FIG. 15 is an embodiment for determining the correction method of the evaluation time tEV when the verify operation is performed through the select bit line sensing method.

Referring to FIG. 15, operation S160 of FIG. 11 includes comparing the number of first fail bits $N_{FB1}$ with the number of second fail bits $N_{FB2}$ (S310), decreasing the evaluation time tEV used during the read operation (S350) when the number of first fail bits $N_{FB1}$ is less than the number of second fail bits $N_{FB2}$ (S330: Yes) and increasing the evaluation time tEV used during the read operation (S370) when the number of first fail bits $N_{FB1}$ is greater than or equal to the number of second fail bits $N_{FB2}$ (S330: No). Differently from above with reference to FIGS. 12A and 12B, the correction method of the evaluation time tEV in a case where the verify operation is performed through the select bit line sensing method may be performed in a direction opposite to that of the correction method of the evaluation time tEV in a case where the verify operation is performed through the all bit line sensing method.

Figure 16A:
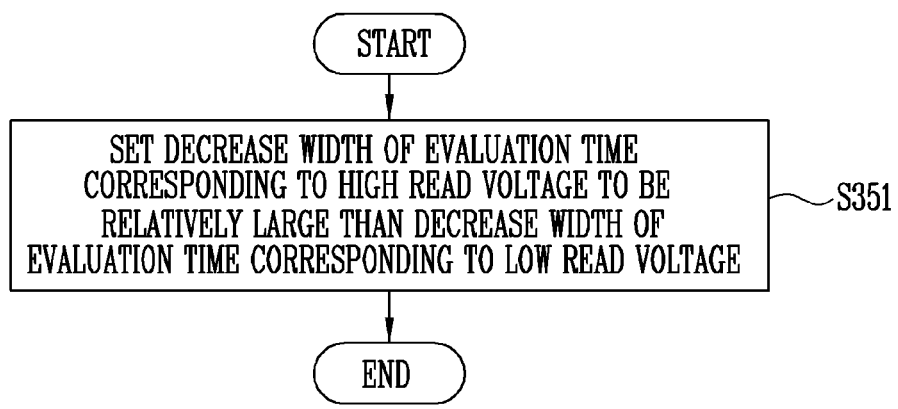
FIGS. 16A and 16B are flowcharts illustrating operations S350 and S370 of FIG. 15, respectively, according to an embodiment of the present disclosure.
Figure 16B:
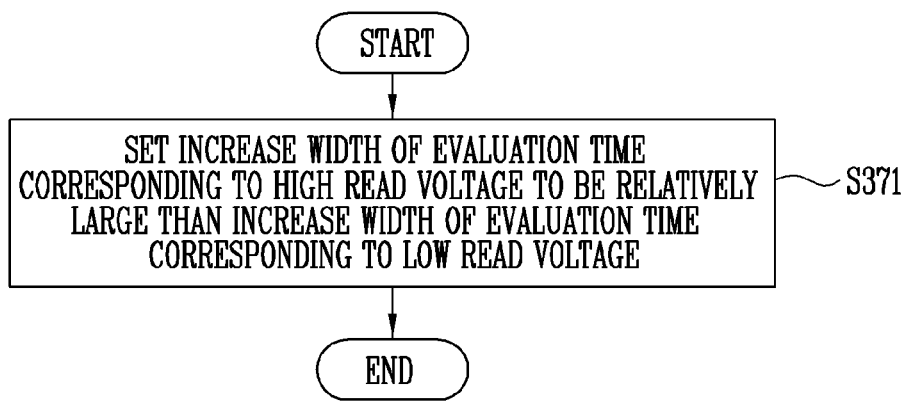

FIGS. 16A and 16B are flowcharts illustrating operations S350 and S370 of FIG. 15, respectively, according to an embodiment of the present disclosure.

Referring to FIG. 16A, decreasing the evaluation time tEV used during the read operation in the select bit line sensing method (S350) includes setting the decrease width of the evaluation time corresponding to the high read voltage to be relatively larger than the decrease width of the evaluation time corresponding to the low read voltage (S351). That is, as described above with reference to FIG. 10A, the decrease width of the evaluation time {tEV−R7} during the sensing operation using the seventh read voltage is set to be the largest, and conversely, the decrease width of the evaluation time {tEV−R1} during the sensing operation using the first read voltage is set to be the smallest.

Referring to FIG. 16B, increasing the evaluation time tEV used during the read operation in the select bit line sensing method (S370) includes setting the increase width of the evaluation time corresponding to the high read voltage to be relatively larger than the increase width of the evaluation time corresponding to the low read voltage (S371). That is, as described above with reference to FIG. 10B, the increase width of the evaluation time {tEV−R7} during the sensing operation using the seventh read voltage is set to be the largest, and conversely, the increase width of the evaluation time {tEV−R1} during the sensing operation using the first read voltage is set to be the smallest.

Figure 17A:
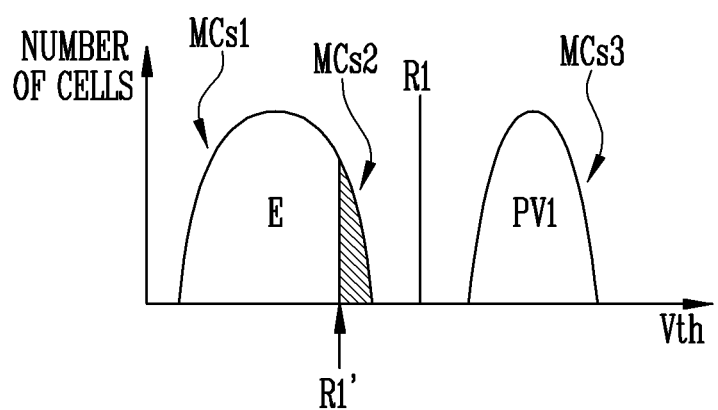
FIGS. 17A and 17B are diagrams illustrating a multi-sensing operation and a normal sensing operation shown in FIG. 11 according to an embodiment of the present disclosure.
Figure 17B:
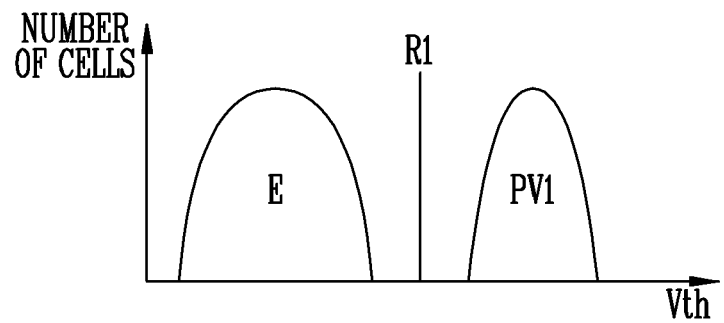

FIGS. 17A and 17B are diagrams illustrating a multi-sensing operation and a normal sensing operation shown in FIG. 11, respectively, according to an embodiment of the present disclosure.

Referring to FIG. 17A, a graph for describing the multi-sensing operation using the first read voltage R1 and an auxiliary voltage R1' associated therewith is shown. In FIG. 17A, by way of example, only a threshold voltage distribution of the erase state E and the first program state PV1 are shown.

In the multi-sensing operation according to an embodiment of the present disclosure, first, the threshold voltage of the memory cells is sensed using the auxiliary voltage R1' smaller than the first read voltage R1. More specifically, the memory cells included in the selected page may be divided into memory cells having a threshold voltage smaller than the auxiliary voltage R1' and memory cells having a threshold voltage greater than the auxiliary voltage R1'.

As shown in FIG. 17A, as a result of first sensing the threshold voltage of the memory cells using the auxiliary voltage R1', first memory cells MCs1 are determined as on-cells, and second memory cells MCs2 and third memory cells MCs3 may be determined as off-cells. A result of the determination may be stored in latches inside the page buffers PB1 to PNm.

Thereafter, the threshold voltage of the memory cells is secondarily sensed using the first read voltage R1. At this time, the sensing operation is not performed on the first memory cells MCs1 that are already determined as the on-cells. This is because the first read voltage R1 is greater than the auxiliary voltage R1', and thus a sensing result may not change with respect to the first memory cells MCs1. Accordingly, the second sensing operation using the first read voltage R1 is performed only on the second memory cells MCs2 and the third memory cells MCs3 determined as the off-cells as a result of the first sensing. As a result of the second sensing, the second memory cells MCs2 may be determined as on-cells, and the third memory cells MCs3 may be determined as off cells.

During the second sensing operation on the second memory cells MCs2 and the third memory cells MCS3, the sensing operation is not performed on the first memory cells MCs1. As an example, bit lines connected to the first memory cells MCs1 may not be precharged during a bit line precharge process for the second sensing operation. In this case, only bit lines connected to the second memory cells MCs2 and the third memory cells MCs3 may be precharged.

As another example, page buffers connected to the first memory cells MCs1 may not operate during the second sensing operation. In this case, only page buffers connected to the second memory cells MCs2 and the third memory cells MCs3 may operate.

During the second sensing operation, since the page buffers connected to the first memory cells MCs1 do not operate, a cell current may not flow through the bit lines connected to the first memory cells MCs1. Accordingly, a source round bouncing or a temporary drop of a power voltage due to a cell current associated with the first memory cells MCs1 may be alleviated. In addition, a bit line coupling may be alleviated. As a result, during the second sensing operation, the page buffers connected to the first memory cells MCs1 do not operate, thereby minimizing noise that may affect a threshold voltage sensing of the second memory cells MCs2 and the third memory cells MCs3. As a result, sensing accuracy may be improved.

Referring to FIG. 17B, a graph for describing the normal sensing operation using the first read voltage R1 according to an embodiment of the present disclosure, is shown. As shown in FIG. 17B, in the normal sensing operation, the threshold voltage of the memory cells is sensed once using the first read voltage R1.

Figure 18A:
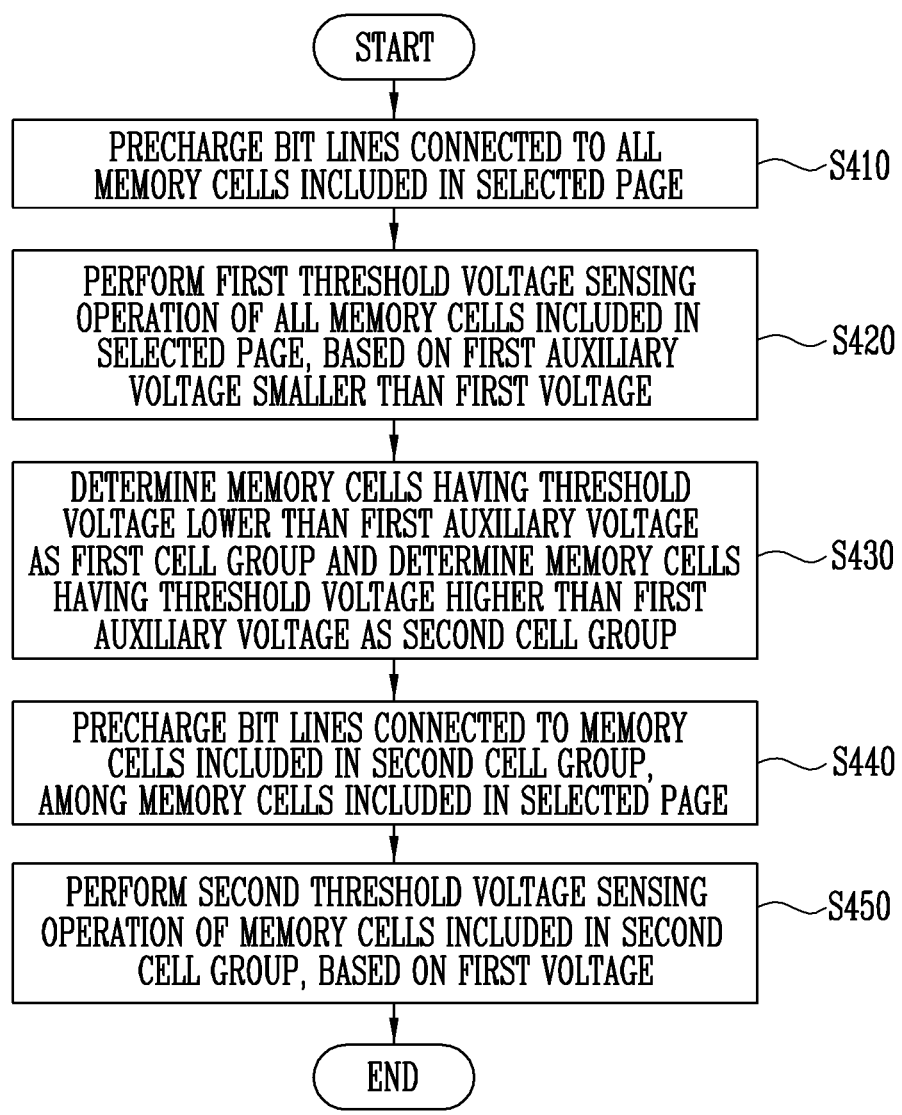
FIGS. 18A and 18B are flowcharts illustrating a multi-sensing operation and a normal sensing operation, respectively, according to an embodiment of the present disclosure.
Figure 18B:
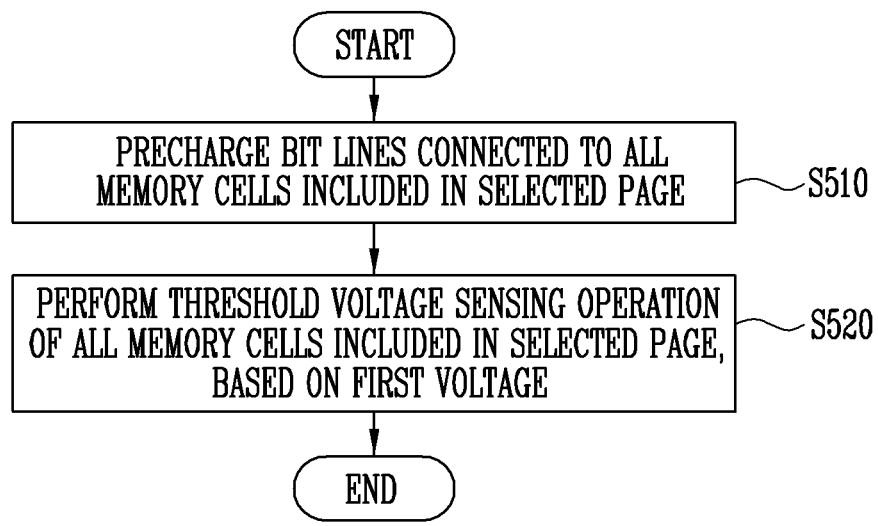

FIGS. 18A and 18B are flowcharts illustrating a multi-sensing operation and a normal sensing operation, respectively, according to an embodiment of the present disclosure.

Referring to FIG. 18A, a flowchart illustrating an embodiment of operation S140 of FIG. 11, is shown. Hereinafter, the multi-sensing operation is described with reference to FIGS. 17A and 18A.

In order to perform the multi-sensing operation on the selected page, first, bit lines connected to all memory cells included in the selected page are precharged (S410). In operation S410, the bit lines respectively connected to the first memory cells MCs1, the second memory cells MCs2, and the third memory cells MCs3 shown in FIG. 17A may be precharged.

Thereafter, a first threshold voltage sensing operation of all memory cells included in the selected page is performed based on a first auxiliary voltage smaller than a first voltage (S420). The first voltage described in operation S420 may correspond to the first read voltage R1 shown in FIG. 17A, and the first auxiliary voltage described in operation S420 may correspond to the auxiliary voltage R1' shown in FIG. 17A.

Thereafter, memory cells having a threshold voltage lower than the first auxiliary voltage are determined as a first cell group, and memory cells having a threshold voltage higher than the first auxiliary voltage are determined as a second cell group (S430). That is, as a result of the first threshold voltage sensing, the first memory cells MCs1 determined as on-cells are determined as the first cell group, and the second and third memory cells MCs2 and MCs3 determined as off-cells are determines as the second cell group.

Thereafter, among the memory cells included in the selected page, bit lines connected to the memory cells included in the second cell group are precharged (S440). As described above with reference to FIG. 17A, in operation S440, only bit lines connected to the second and third memory cells MCs2 and MCs3 may be precharged.

Thereafter, a second threshold voltage sensing operation of the memory cells included in the second cell group is performed based on the first voltage (S450). In operation S450, the second threshold voltage sensing operation is not performed on the first memory cells MCs1, and the threshold voltage sensing operation is performed only on the second and third memory cells MCs2 and MCs3. As a result of the second threshold voltage sensing, the determination of the second memory cells MCs2 may be changed from off-cells to on-cells. As a result of the second threshold voltage sensing, the third memory cells MCs3 may maintain the determination of the off-cell. In addition, regardless of the second threshold voltage sensing, the first memory cells MCs1 may maintain the determination of the on-cell.

Referring to FIG. 18B, a flowchart illustrating an operation S120 of FIG. 11 according to an embodiment of the present disclosure, is shown. Hereinafter, the multi-sensing operation is described with reference to FIGS. 17B and 18B.

In order to perform the normal sensing operation on the selected page, first, bit lines connected to all memory cells included in the selected page are precharged (S510). Thereafter, a threshold voltage sensing operation of all memory cells included in the selected page is performed based on a first voltage (S520). The first voltage described in operation S520 may correspond to the first read voltage R1 shown in FIG. 17B. As shown in FIG. 18B, the normal sensing operation performs one sensing operation with the first voltage, that is, the first read voltage, without using the auxiliary voltage.

An example in which the multi-sensing operation and the normal sensing operation are performed using the first read voltage R1 and the auxiliary voltage R1' of a size smaller than that of the first read voltage R1 is described with reference to FIGS. 17A and 17B. However, this is an example, and the multi-sensing operation may be performed by setting appropriate auxiliary voltages with respect to each of the second read voltage R2 to the seventh read voltage R7.

Figure 19:
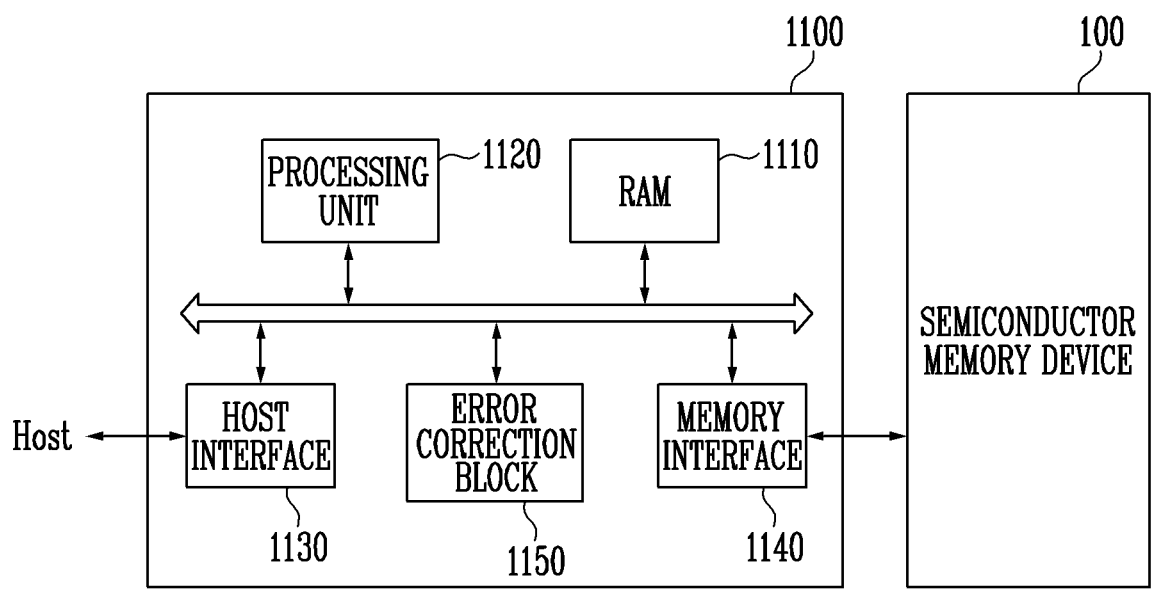
FIG. 19 is a block diagram illustrating a memory system 1000 including the semiconductor memory device 100 of FIG. 2 according to an embodiment of the present disclosure.

FIG. 19 is a block diagram illustrating a memory system 1000 including the semiconductor memory device 100 of FIG. 2 according to an embodiment of the present disclosure.

Referring to FIG. 19, the memory system 1000 includes the semiconductor memory device 100 and the controller 1100. The semiconductor memory device 100 may be the semiconductor memory device described with reference to FIG. 2. Hereinafter, repetitive description is omitted.

The controller 1100 is connected to the host Host and the semiconductor memory device 100. The controller 1100 is configured to access the semiconductor memory device 100 in response to the request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as any of an operation memory of the processing unit 1120, a cache memory between the semiconductor memory device 100 and the host Host, and a buffer memory between the semiconductor memory device 100 and the host Host. The processing unit 1120 controls overall operations of the controller 1100. In addition, the controller 1100 may temporarily store program data provided from the host Host during the write operation.

The host interface 1130 includes a protocol for performing data exchange between the host Host and the controller 1100. In an embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 includes a NAND interface or a NOR interface.

The error correction block 1150 is configured to detect and correct an error of data received from the semiconductor memory device 100 using an error correcting code (ECC). In an embodiment, the error correction block 1150 may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device to configure a memory card. For example, the controller 1100 and the semiconductor memory device 100 may be integrated into one semiconductor device to form a memory card such as a PC card (personal computer memory card international association (PCMCIA)), a compact flash card (CF), a smart media card (e.g., SM or SMC), a memory stick, a multimedia card (e.g., MMC, RS-MMC, or MMCmicro), a secure digital (SD) card (e.g., SD, miniSD, microSD, or SDHC), and a universal flash storage (UFS).

The controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host Host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100 or the memory system 1000 may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 20:
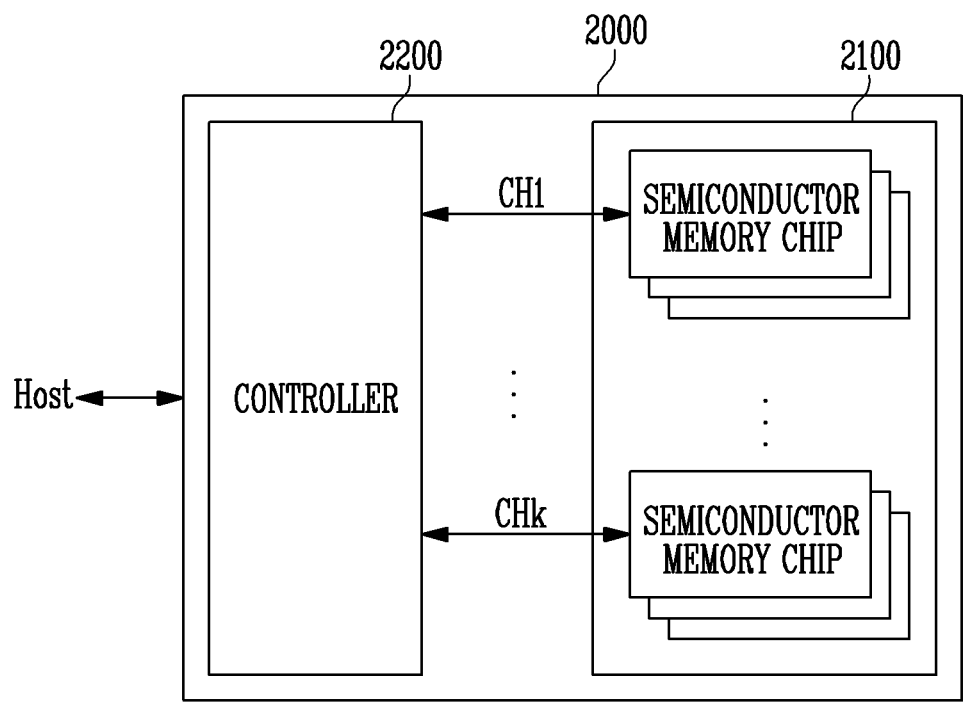
FIG. 20 is a block diagram illustrating an application example of the memory system of FIG. 19 according to an embodiment of the present disclosure.

FIG. 20 is a block diagram illustrating an application example of the memory system 1000 of FIG. 19 according to an embodiment of the present disclosure.

Referring to FIG. 20, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 20, the plurality of groups communicate with the controller 2200 through first to k-th channels CH1 to CHk, respectively. Each semiconductor memory chip may be configured and operated similarly to that of the semiconductor memory device 100 described with reference to FIG. 2.

Each group is configured to communicate with the controller 2200 through one common channel. The controller 2200 is configured similarly to the controller 1100 described with reference to FIG. 19 and is configured to control the plurality of memory chips of the semiconductor memory device 2100 through the plurality of channels CH1 to CHk.

Figure 21:
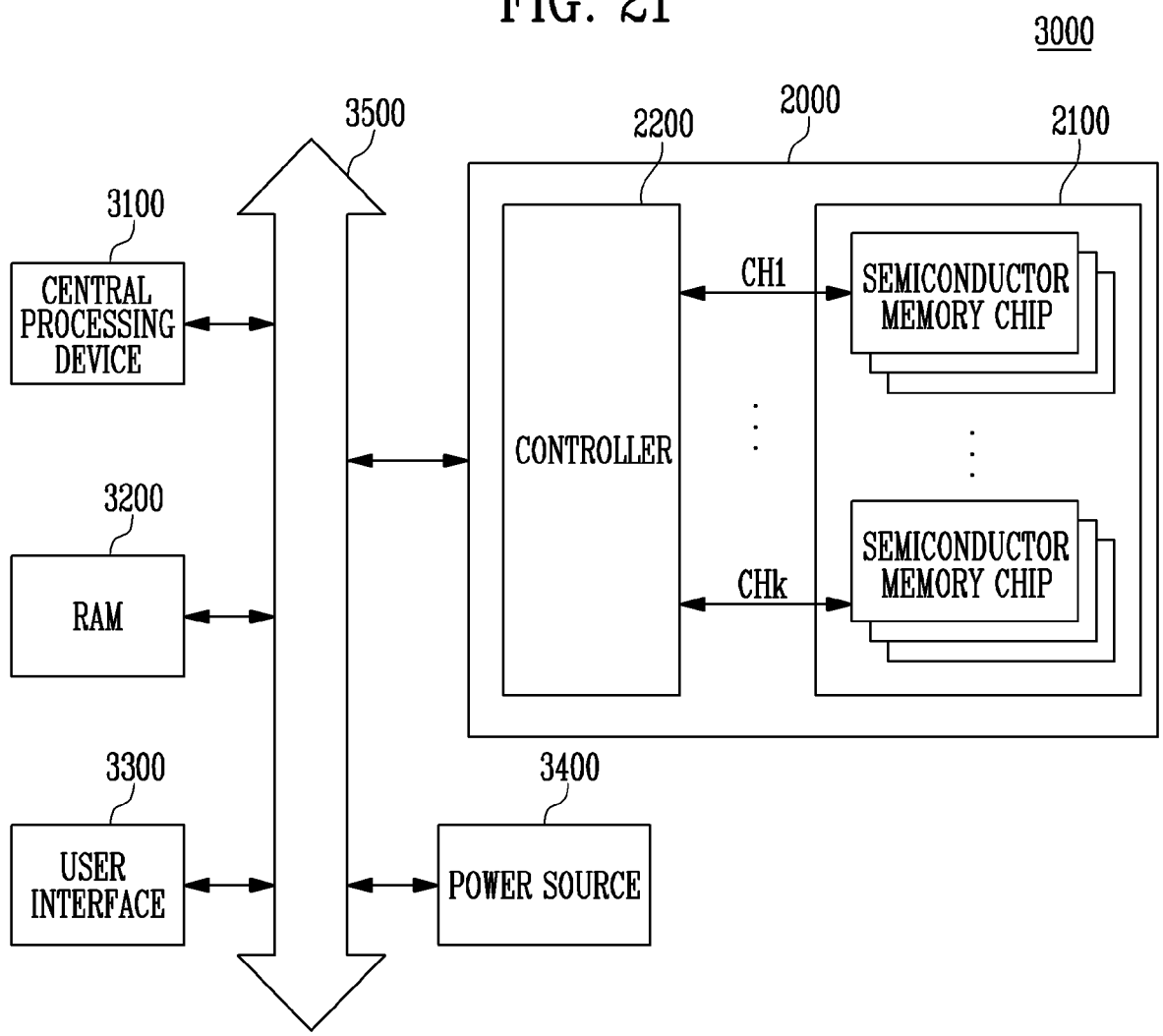
FIG. 21 is a block diagram illustrating a computing system including the memory system described with reference to FIG. 20 according to an embodiment of the present disclosure.

FIG. 21 is a block diagram illustrating a computing system 3000 including the memory system 2000 described with reference to FIG. 20 according to an embodiment of the present disclosure.

Referring to FIG. 21, the computing system 3000 includes a central processing device 3100, a random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 21, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 21, the memory system 2000 described with reference to FIG. 20 is provided. However, the memory system 2000 may be replaced with the memory system 1000 described with reference to FIG. 19. In an embodiment, the computing system 3000 may be configured to include both of the memory systems 1000 and 2000 described with reference to FIGS. 19 and 20.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, managers, units, compressors, decompressors, multiplexers, generators, logic, interfaces, decoders, drivers, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While various embodiments have been described above, it will be understood to those skilled in the art that the embodiments described are examples only. Accordingly, the data storage apparatus and the operation method, which have been described herein, should not be limited based on the described embodiments. It should be understood that many variations and modifications of the basic inventive concept described herein will still fall within the spirit and scope of the present disclosure as defined in the following claims.

What is claimed is:

1. A semiconductor memory device comprising:
a memory cell array including a plurality of memory cells;
a peripheral circuit configured to perform a program operation and a read operation on the memory cell array; and
a control logic configured to control an operation of the peripheral circuit,
wherein the control logic controls the peripheral circuit to perform a single-level cell (SLC) program operation on memory cells included in a selected page among the plurality of memory cells, compares the number of first fail bits with the number of second fail bits, the first fail bits determined by performing a normal sensing operation on the selected page and the second fail bits determined by performing a multi-sensing operation on the selected page, and corrects at least one evaluation time to be used for a read operation based on a result of the comparison.

2. The semiconductor memory device of claim 1, wherein the control logic controls the peripheral circuit to use an all bit line sensing method during a verify operation, and
when the number of the first fail bits is less than the number of the second fail bits, the control logic increases the evaluation time to be used for the read operation.

3. The semiconductor memory device of claim 2, wherein the control logic determines an increase width of an evaluation time corresponding to a low read voltage to be larger than an increase width of an evaluation time corresponding to a high read voltage.

4. The semiconductor memory device of claim 1, wherein the control logic controls the peripheral circuit to use an all bit line sensing method during a verify operation, and
wherein, when the number of the first fail bits is greater than the number of the second fail bits, the control logic decreases the evaluation time to be used for the read operation.

5. The semiconductor memory device of claim 4, wherein the control logic determines a decrease width of an evaluation time corresponding to a low read voltage to be larger than a decrease width of an evaluation time corresponding to a high read voltage.

6. The semiconductor memory device of claim 1, wherein the control logic controls the peripheral circuit to use a select bit line sensing method during a verify operation, and
wherein when the number of the first fail bits is less than the number of the second fail bits, the control logic decreases the evaluation time to be used for the read operation.

7. The semiconductor memory device of claim 6, wherein the control logic determines a decrease width of an evaluation time corresponding to a high read voltage to be larger than the decrease width of an evaluation time corresponding to a low read voltage.

8. The semiconductor memory device of claim 1, wherein the control logic controls the peripheral circuit to use a select bit line sensing method during a verify operation, and
wherein when the number of the first fail bits is greater than the number of the second fail bits, the control logic increases the evaluation time to be used for the read operation.

9. The semiconductor memory device of claim 1, wherein the multi-sensing operation is performed by first sensing a threshold voltage of memory cells included in the selected page in a state in which a predetermined auxiliary voltage is applied to a word line connected to the selected page, and by secondly sensing a threshold voltage of remaining memory cells except for memory cells determined as an on-cell as a result of the first sensing by applying a main voltage larger than the auxiliary voltage to the word line connected to the selected page.

10. The semiconductor memory device of claim 8, wherein the control logic determines an increase width of an evaluation time corresponding to a high read voltage to be larger than an increase width of an evaluation time corresponding to a low read voltage.

11. A method of operating a semiconductor memory device including a plurality of memory cells, the method comprising:
performing a single-level cell (SLC) program operation on selected memory cells among the plurality of memory cells;
performing a normal sensing operation on the selected memory cells based on a first voltage and an auxiliary voltage less than the first voltage;
determining the number of first fail bits according to the normal sensing operation;
performing a multi-sensing operation on the selected memory cells based on the first voltage;
determining the number of second fail bits according to the multi-sensing operation; and
determining a correction method of at least one evaluation time used for a read operation based on the number of the first fail bits and the number of the second fail bits.

12. The method of claim 11, wherein determining the correction method of the evaluation time used for the read operation based on the number of the first fail bits and the number of the second fail bits comprises:
comparing the number of the first fail bits and the number of the second fail bits; and
determining to increase the evaluation time to be used for the read operation in response to a determination that the number of the first fail bits is less than the number of the second fail bits.

13. The method of claim 12, wherein determining to increase at least one evaluation time used for the read operation in response to the determination that the number of the first fail bits is less than the number of the second fail bits comprises determining an increase width of an evaluation time corresponding to a low read voltage to be larger than an increase width of an evaluation time corresponding to a high read voltage.

14. The method of claim 11, wherein determining the correction method of the evalution time used for the read operation based on the number of the first fail bits and the number of the second fail bits comprises:
comparing the number of the first fail bits and the number of the second fail bits; and
determining to decrease the evaluation time to be used for the read operation in response to determination that the number of the first fail bits is greater than the number of the second fail bits.

15. The method of claim 14, wherein determining to decrease at least one evaluation time used during the read operation in response to the determination that the number of the first fail bits is greater than the number of the second fail bits comprises determining a decrease width of an evaluation time corresponding to a low read voltage to be larger than a decrease width of an evaluation time corresponding to a high read voltage.

16. The method of claim 11, wherein determining the correction method of the evaluation time used for the read operation based on the number of the first fail bits and the number of the second fail bits comprises:
    comparing the number of the first fail bits and the number of the second fail bits; and
    determining to decrease the evaluation time to be used for the read operation in response to a determination that the number of the first fail bits is less than the number of the second fail bits.

17. The method of claim 16, wherein determining to decrease at least one evaluation time used during the read operation in response to the determination that the number of the first fail bits is less than the number of the second fail bits comprises determining a decrease width of an evaluation time corresponding to a high read voltage to be larger than a decrease width of an evaluation time corresponding to a low read voltage.

18. The method of claim 11, wherein determining the correction method of the evaluation time used for the read operation based on the number of the first fail bits and the number of the second fail bits comprises:
    comparing the number of the first fail bits and the number of the second fail bits; and
    determining to increase the evaluation time to be used for the read operation in response to determination that the number of the first fail bits is greater than the number of the second fail bits.

19. The method of claim 18, wherein determining to increase at least one evaluation time used during the read operation in response to the determination that the number of the first fail bits is greater than the number of the second fail bits comprises determining an increase width of an evaluation time corresponding to a high read voltage to be larger than an increase width of an evaluation time corresponding to a low read voltage.

20. The method of claim 11, further comprising:
    correcting at least one evaluation time used for the read operation based on the determined correction method.

21. The method of claim 11, wherein performing the multi-sensing operation on the selected memory cells based on the first voltage comprises:
    precharging bit lines connected to the selected memory cells;
    sensing a threshold voltage of the selected memory cells based on the auxiliary voltage;
    precharging first memory cells determined as an off-cell as a result of the sensing among the selected memory cells; and
    re-sensing a threshold voltage of the first memory cells based on the first voltage.

22. A semiconductor memory device comprising:
    a memory cell array including a plurality of memory cells; and
    a control logic configured to:
    perform a program operation on memory cells that are included in a selected page among the plurality of memory cells;
    determine first fail bits by performing a normal sensing operation on the selected page;
    determine second fail bits by performing a multi-sensing operation on the selected page;
    compare the number of first fail bits with the number of second fail bits;
    adjust at least one evaluation time for one or more read voltages associated with a read operation based on the comparison result and a bit line sensing scheme; and
    perform the read operation on the selected page based on the adjusted evaluation time.

\* \* \* \* \*